(12) United States Patent
Kang et al.

(10) Patent No.: US 7,939,880 B2
(45) Date of Patent: May 10, 2011

(54) SPLIT GATE NON-VOLATILE MEMORY CELL

(75) Inventors: Sung-Taeg Kang, Austin, TX (US); Rode R. Mora, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 375 days.

(21) Appl. No.: 12/103,451

(22) Filed: Apr. 15, 2008

(65) Prior Publication Data

US 2009/0256186 A1 Oct. 15, 2009

(51) Int. Cl.
*H01L 29/788* (2006.01)
(52) U.S. Cl. ........................ 257/324; 257/319
(58) Field of Classification Search .......... 257/314–324, 257/E29.309, E21.423
See application file for complete search history.

(56) References Cited

U.S. PATENT DOCUMENTS

| | | | |
|---|---|---|---|
| 6,465,837 B1 * | 10/2002 | Wu | 257/315 |
| 7,355,240 B2 * | 4/2008 | Tu et al. | 257/315 |
| 7,456,465 B2 * | 11/2008 | Prinz et al. | 257/315 |
| 7,544,980 B2 | 6/2009 | Chindalore et al. | |
| 7,732,278 B2 * | 6/2010 | Prinz et al. | 257/316 |
| 2005/0085039 A1 | 4/2005 | Yasui et al. | |
| 2005/0199940 A1 | 9/2005 | Mine et al. | |

OTHER PUBLICATIONS

Palestri et al; "Effect of the gap size on the SSI efficiency of split-gate memory cells"; IEEE Transactions on Electron Devices, vol. 53, Issue 3, Mar. 2006 pp. 488-493.
Non-Published U.S. Appl. No. 11/671,809, filed Feb. 6, 2007, showing Brian A. Winstead as the first named inventor.
Non-Published U.S. Appl. No. 12/103,246, filed Apr. 15, 2008, showing Ted R. White as the first named inventor.

* cited by examiner

*Primary Examiner* — Cuong Q Nguyen

(57) ABSTRACT

A non-volatile memory (NVM) cell comprising a layer of discrete charge storing elements, a control gate, and a select gate is provided. The control gate has a first sidewall with a lower portion being at least a first angle 10 degrees away from 90 degrees with respect to substrate. Further, the select gate has a second sidewall with a lower portion being at least a second angle at least 10 degrees away from 90 degrees with respect to the substrate. The NVM cell further comprises a layer of dielectric material located between the first sidewall and the second sidewall.

21 Claims, 24 Drawing Sheets

SPLIT GATE NON-VOLATILE MEMORY CELL

BACKGROUND OF THE INVENTION

1. Field of Invention

This disclosure relates generally to semiconductor devices, and more specifically to fabricating a non-volatile memory cell.

2. Background

In the field of non-volatile memory devices, various electrically erasable programmable memory devices are widely used in electronic circuits. Some types of electrically erasable programmable memory devices can be programmed and erased repeatedly and are capable of holding charge even after getting disconnected from power supply. Some of these devices utilize discrete charge storing elements called nanoclusters for storing charges in a charge storage location of a transistor. In some cases, the nanoclusters are embedded in an insulator such as a tunnel dielectric (e.g. an oxide).

One type of non-volatile memory cell includes a transistor with a control gate, a charge storing structure and a select gate, which may be referred to as a split gate transistor. In one type of split gate transistor, the charge storing structure includes nanoclusters embedded in an insulating layer to hold the charge. The nanoclusters in the angular gap between the lower portion of the select gate and the dielectric oxide layer over the substrate affect the threshold voltage and speed of the program/erase cycles of the non-volatile memory cell.

In conventional split gate transistors with nanoclusters, the structure of the select gate is such that its lower portion has an angle of 90° with respect to the substrate. Due to this structure, the area near the base of the select gate and the control dielectric is large. Therefore, the nanoclusters formed in this gap may be relatively large in size. The charges stored on these big nanoclusters in the gap may be difficult to erase and require a high erase voltage to discharge them. During the program/erase cycles of the non-volatile memory cell, due to trapping of charges in the gap nanoclusters, the erase voltage required increases with each cycle due to charges being trapped in the gap nanoclusters. This reduces the cycling endurance of the memory cell. Further, the conventional transistors have a thick dielectric layer on the channel. Due to this, read voltage cannot be lowered and cell currents are reduced. This also causes general cell performance to decrease. Thus, there exists a need for reducing the size of gap nanoclusters, so that they are uniform in size with respect to other nanoclusters in the charge storing layer.

Another disadvantage of the vertical select gate structure is that nanoclusters in the charge storing layer get accumulated at the bottom. Due to this the number of nanoclusters that affect the channel during program/erase cycle are more and consequently the threshold voltage ($V_t$) of program/erase increases. Thus, there exists a need for reducing the number of gap nanoclusters affecting the channel, as well as a need for reducing the effective area of the insulating layer surrounding the nanoclusters that affect the channel.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. Elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
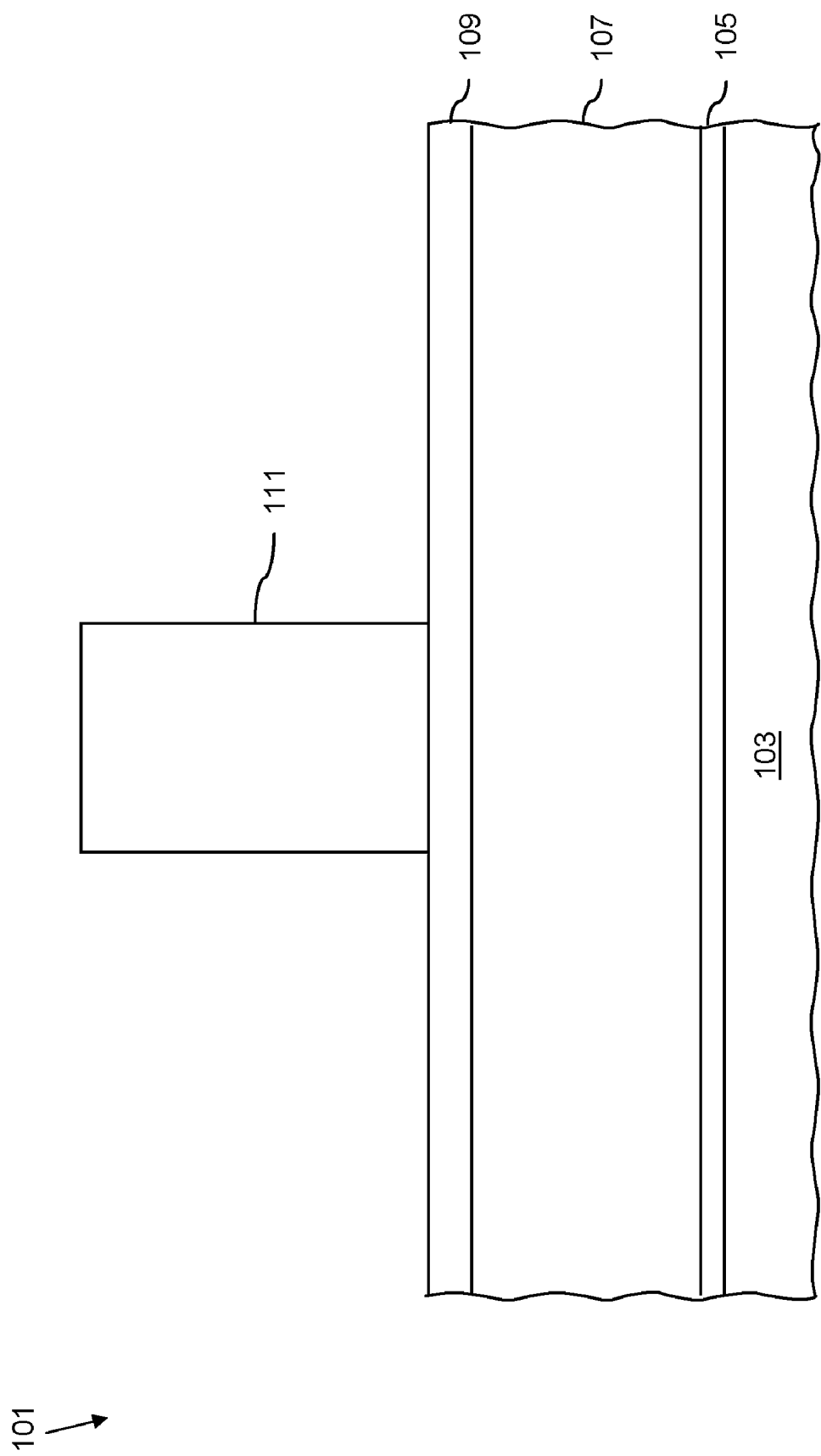
FIGS. 1-9 illustrate, in partial cutaway cross-sectional views, various stages of a wafer in the manufacture of a non-volatile memory device, in accordance with a first embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment, a non-volatile memory cell is provided. The non-volatile memory cell includes a substrate, a first current electrode region located in the substrate, a second current electrode region located in the substrate, a layer of discrete charge storing elements for non volatilely storing charge, a control gate located over the substrate, a select gate located over the substrate, and a layer of dielectric material located between the first sidewall and the second sidewall. The control gate has a first sidewall with a lower portion, with the lower portion being at an angle with respect to the substrate. The angle of the lower portion is at least 10 degrees away from 90 degrees with respect to the substrate. Further, the select gate has a second sidewall with a lower portion, and the second sidewall is facing the first sidewall. In addition, the lower portion of the second sidewall is at an angle with respect to the substrate which is at least 10 degrees away from 90 degrees with respect to the substrate.

In another embodiment, a method of making a non-volatile memory cell is provided. The method includes forming a layer of discrete charge storing elements over a substrate. The method also includes forming a first gate over the substrate, where the first gate is either a select gate or a control gate. Further, forming the first gate further includes forming a layer of gate material and etching the layer of gate material. The first gate has a first sidewall with a lower portion that is at an angle with respect to the substrate, where the angle is at least 10 degrees away from 90 degrees with respect to the substrate. In addition, the method includes forming a second gate over the substrate. The second gate is either the select gate or the control gate. The second gate has a second sidewall facing the first sidewall. Further, the method includes forming a layer of dielectric material having a portion located between the first sidewall and the second sidewall.

In yet another embodiment, a non volatile memory cell is provided. The non volatile memory cell includes a substrate, a first current electrode region located in the substrate, a second current electrode region located in the substrate, a layer of discrete charge storing elements for non volatilely storing charge, a control gate located over the substrate, a select gate located over the substrate, and a layer of dielectric material located between the select gate and the control gate. The select gate includes a first portion formed from a first layer of gate material. The first portion has a first sidewall having an angle of approximately 90 degrees with respect to the substrate. Further, the select gate includes a spacer portion formed from a layer of polysilicon. The spacer portion is located adjacent to the first sidewall of the first portion. The spacer portion has a second sidewall. The lower portion of the second sidewall is at an angle that is at least 10 degrees away from 90 degrees with respect to the substrate.

In yet another embodiment, a non volatile memory cell is provided. The non volatile memory cell includes a substrate, a first current electrode region in the substrate, a second current electrode region in the substrate, a select gate located over the substrate, a control gate over the substrate, and a layer of discrete charge storing elements for non volatilely storing charge. The select gate is formed with a lower portion that is at an angle in a range between 80° and 50° with respect to the substrate. The layer of discrete charge storing elements is located between the select gate and the control gate.

In yet another embodiment, a non volatile memory cell is provided. The non volatile memory cell includes a substrate, a first current electrode region located in the substrate, a second current electrode region located in the substrate, a layer of discrete charge storing elements for non volatilely storing charge, a control gate located over the substrate, a select gate having a portion located over the control gate. The layer of discrete charge storage elements is formed above the substrate and the control gate is formed above the layer of discrete charge storage elements. The lower portion of the control gate has an angle in a range between 100° and 150° with respect to the substrate. The layer of discrete charge storage elements is patterned using the control gate as a mask and thereafter the select gate is formed having a portion located over the control gate.

Referring now to FIG. 1, the figure illustrates a cutaway cross-section of a portion of a semiconductor wafer 101. The semiconductor wafer 101 includes a substrate 103, a gate dielectric 105, a layer of gate material 107, an antireflective coating layer (ARC) 109, and a photo-resist mask 111. The substrate 103 may be any semiconductor material or combination of materials, such as gallium arsenide, silicon, germanium, monocrystalline silicon or any other active material that is conventionally used to form semiconductor devices. In one embodiment, substrate may be made of a bulk material or may have a semiconductor on insulator (SOI) configuration. The gate dielectric 105 is deposited over the substrate 103. The gate dielectric 105 may be any oxide such as silicon oxide, aluminum oxide, tantalum oxide, titanium dioxide, hafnium oxide, zirconium dioxide, another dielectric material with a high dielectric constant (k) (e.g. k greater than 7), or any combination thereof. In a preferred embodiment, the thickness of the gate dielectric 105 is approximately 22 Å, but may be of other thicknesses in other embodiments. In one embodiment, gate dielectric 105 may be thermally grown form substrate 103.

The layer of gate material 107 is then deposited over the gate dielectric 105. In some embodiments, the layer of gate material 107 has a thickness range between 800 Å and 1800 Å, but may have other thicknesses in other embodiments. In a preferred embodiment, the layer of gate material 107 has a thickness 1200 Å. Examples of the layer of gate material 107 may include, but are not limited to, polysilicon, amorphous silicon (Si), a metal, Germanium (Ge), SiGe, or any combination thereof. The ARC layer 109 with a thickness ranging between 155 Å and 1500 Å is deposited over the layer of gate material 107. Layer 109 may be of other thicknesses in other embodiments. The ARC layer may include in some embodiments, Bottom Antireflective Coating (BARC), Organic Antireflective Coating (OARC), nitride, or oxide or any combination thereof. Layer 109 may be formed using a nitride (e.g., TiN), a metal-silicon nitride (e.g., $Ta_aSi_bN_c$), such as silicon nitride, a metal-containing nitride, or any combination thereof.

Above ARC layer 109, a patterned mask 111 is formed. The patterned mask 111 may be any photo-resist material. The photo-resist material may include a variety of photo-resist chemicals suitable for lithographic applications. In one embodiment, the photo-resist material comprises of a matrix material or resin, a sensitizer or inhibitor, and a solvent. The material of mask 111 can be a positive photo-resist material or a negative photo-resist material.

Figure 2:
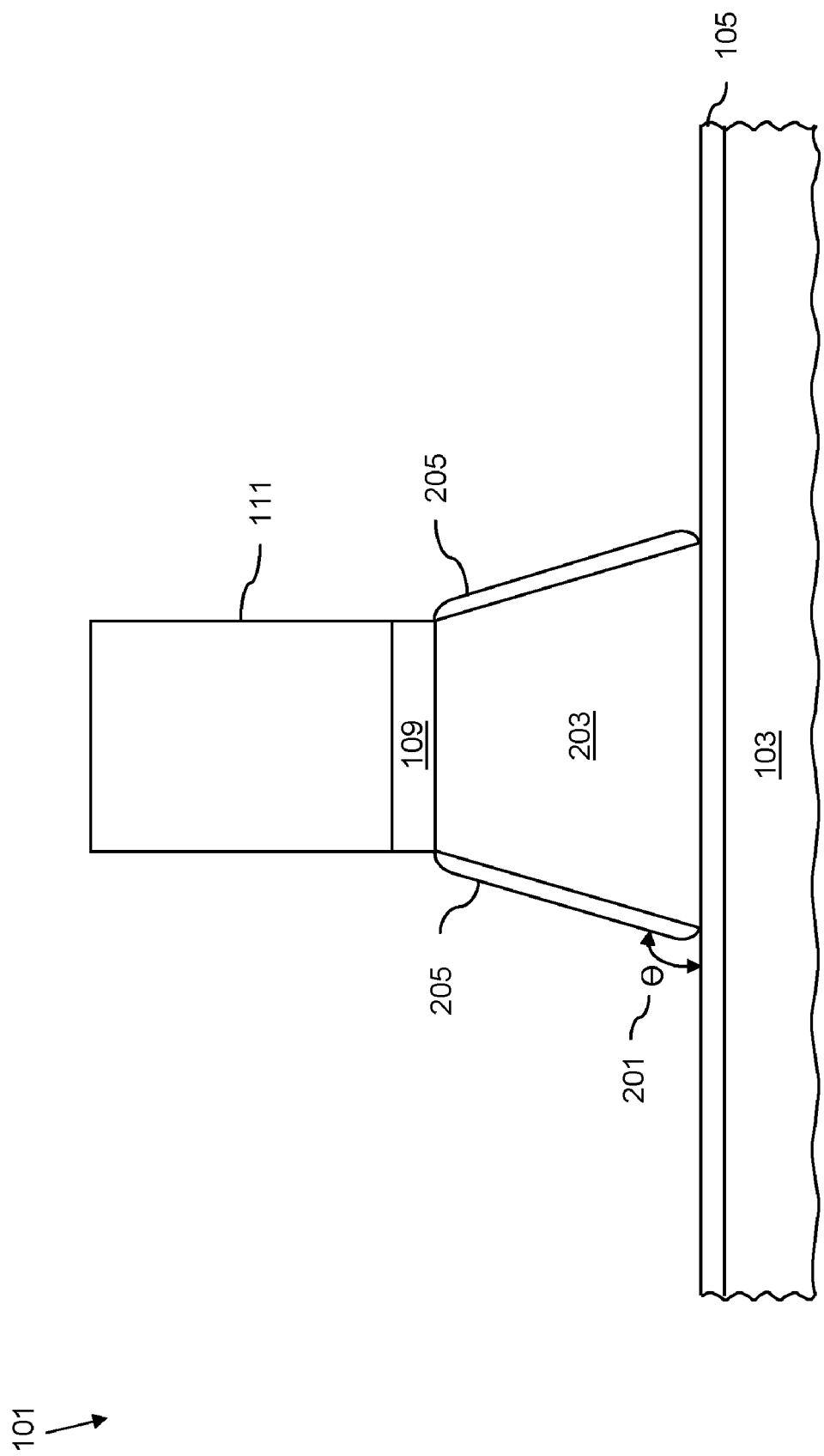

As illustrated in FIG. 2, etching is performed using the patterned mask 111. Layer 109 is etched vertically and then the exposed layer of gate material 107 is etched to form a gate structure with a slope. In one embodiment, the slope has an angle $\Theta$ 201 in a range between 100° and 140° with respect to the substrate 103. In a preferred embodiment, the slope has the angle $\Theta$ 201 of 110° with respect to the substrate 103. The sloped gate structure is obtained by varying the etch chemistry during etching of the gate as compared to etching of layer 109. In the preferred embodiment, the etch is an anisotropic dry etch.

In a first embodiment where layer 109 is nitride, layer 109 is etched using a fluorinated chemistry such as carbon tetrafluoride ($CF_4$) and argon (Ar). The layer of gate material 107 is then etched to form a select gate 203 using an etchant with an etch chemistry that includes hydrogen bromide (HBr) and chlorine (Cl). The etching process is controlled to achieve a sloped gate structure. This is done by increasing the amount of HBr in the etch chemistry. Typically, the ratio in the volume of HBr to Cl is at least 2.5 to 1. During the etching process, due to the high proportion of HBr in the etch chemistry, a thin layer of polymer 205 having a thickness of approximately 10 nm is deposited along the sides of the select gate 203 during the etching process. This etch chemistry may be suitable when the ARC layer 109 is 155 Å thick.

In a second embodiment, the polymer layer 205 is created before etching of the select gate 203, to obtain the sloped gate structure. This is done by using a thicker ARC layer than that used in the first embodiment and increasing the amount of polymerization during the etching of layer 109. In this embodiment, the thickness of the ARC layer 109 is of the range closer to 1500 Å. The amount of polymerization is increased by using a polymerizing chemistry such as Carbon Hydro-Trifluoride ($CHF_3$) instead of $CF_4$ in the etch chemistry. Due to the ARC layer 109 being thicker, it is slightly tapered at the bottom during etching and the polymer layer 205 is deposited during etching. The etching occurs in such a way that the thick ARC layer 109 is etched vertically and the select gate is formed with sloped edges.

Figure 3:
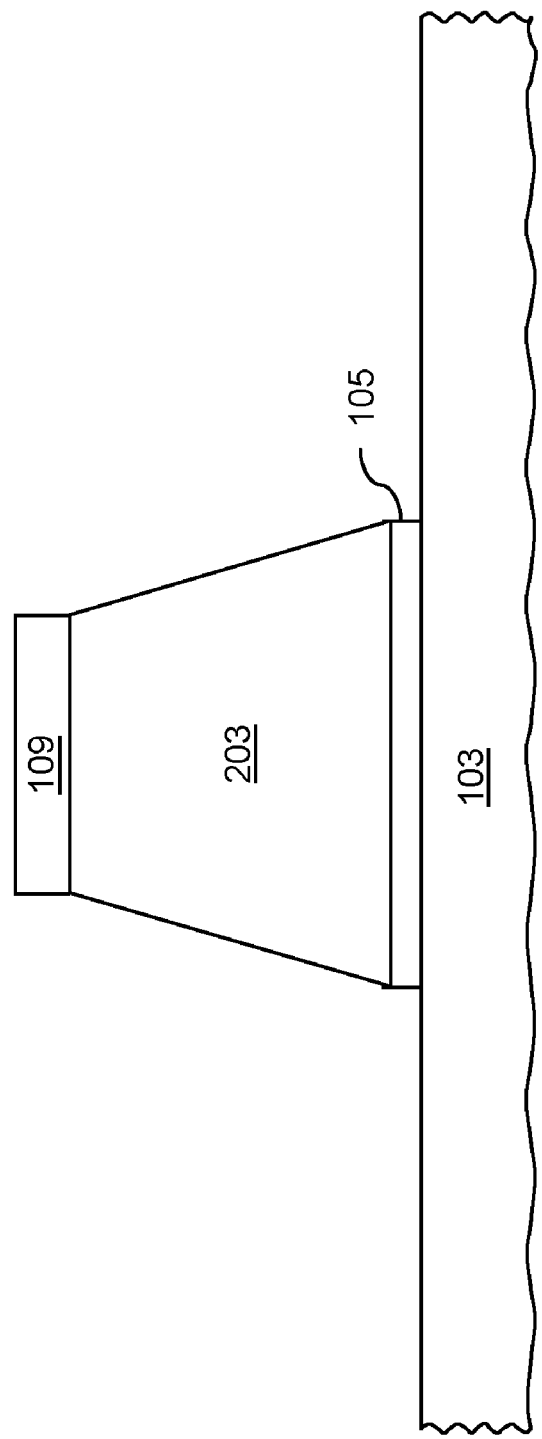

As shown in FIG. 3 the patterned mask 111 and the thin layer of polymer 205 are removed. The patterned mask 111 and the thin layer of polymer 205 are removed using conventional oxygen/nitrogen plasma ashing process. Subsequently, the exposed gate dielectric 105 outside the select gate 203 is removed using wet etching.

Figure 4:
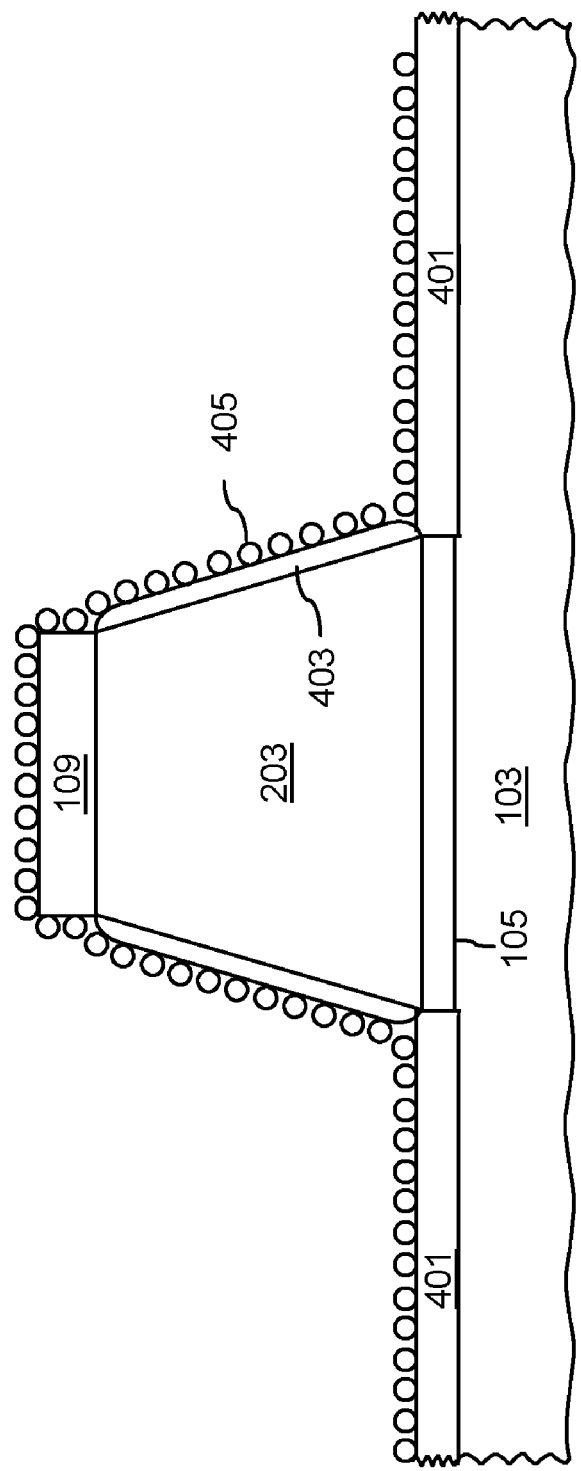

Referring to FIG. 4, a layer of oxide 401 having thickness ranging between 40 Å and 80 Å is grown on the substrate 103 and the sloped edges of the select gate 203. The layer of oxide 401 is grown using thermal oxidation. In another embodiment, the layer of oxide 401 is deposited on the substrate 103. During the formation of the layer of oxide 401 on the substrate 103, the layer is also formed on the select gate 203. In FIG. 4, the layer of oxide grown on the select gate 203 is referred to as layer 403. In a preferred embodiment, the thickness of the oxide layer 401 is 60 Å, but may be of other thicknesses in other embodiments.

A layer of discrete charge storing elements 405 is then formed over the layer of oxide 401. In an illustrated embodiment, nanoclusters represented by small circles in FIG. 4 are the discrete charge storing elements 405. These nanoclusters are typically formed of silicon, but they may also be formed of other materials, for example, germanium, gold, copper, platinum or any combination of these. In one embodiment, the layer of discrete charge storing elements 405 is formed by depositing a thin continuous amorphous film of silicon over the semiconductor wafer 101 and then annealing at high temperature to crystallize the silicon and isolate the crystals. In other embodiments, the layer of discrete charge storing elements 405 may be deposited by different process techniques. In one embodiment, each of the nanoclusters has a thickness ranging between 20 Å to 200 Å, but may have other thicknesses in other embodiments. In a preferred embodiment, the thickness of each of the nanoclusters is 70 Å. Here, the size of each of the nanoclusters is uniform because of the angled sidewalls of the select gate 203. Due to the angled sidewalls of the select gate 203, the area near the base of the select gate 203 and the layer of oxide 401 is not large as is in the case if the select gate 203 has vertical sidewalls.

Figure 5:
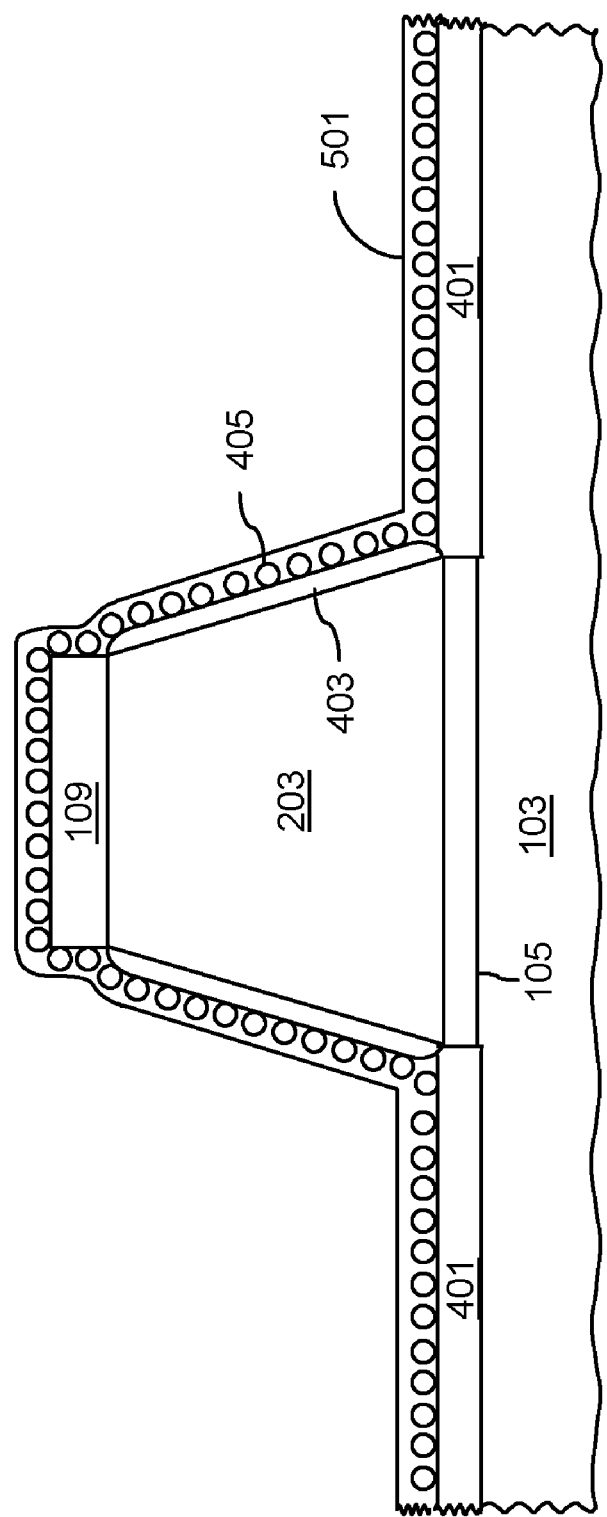

As shown in FIG. 5, a layer of tunnel dielectric 501 is deposited over the layer of discrete charge storing elements 405. Examples of the tunnel dielectric 501 include, but are not limited to, oxides such as silicon-oxide, hafnium-oxide, a high-K dielectric and the like. In some embodiments, prior to depositing the tunnel dielectric 501, nitridzation is performed by depositing a layer of nitride over each nanocluster.

Figure 6:
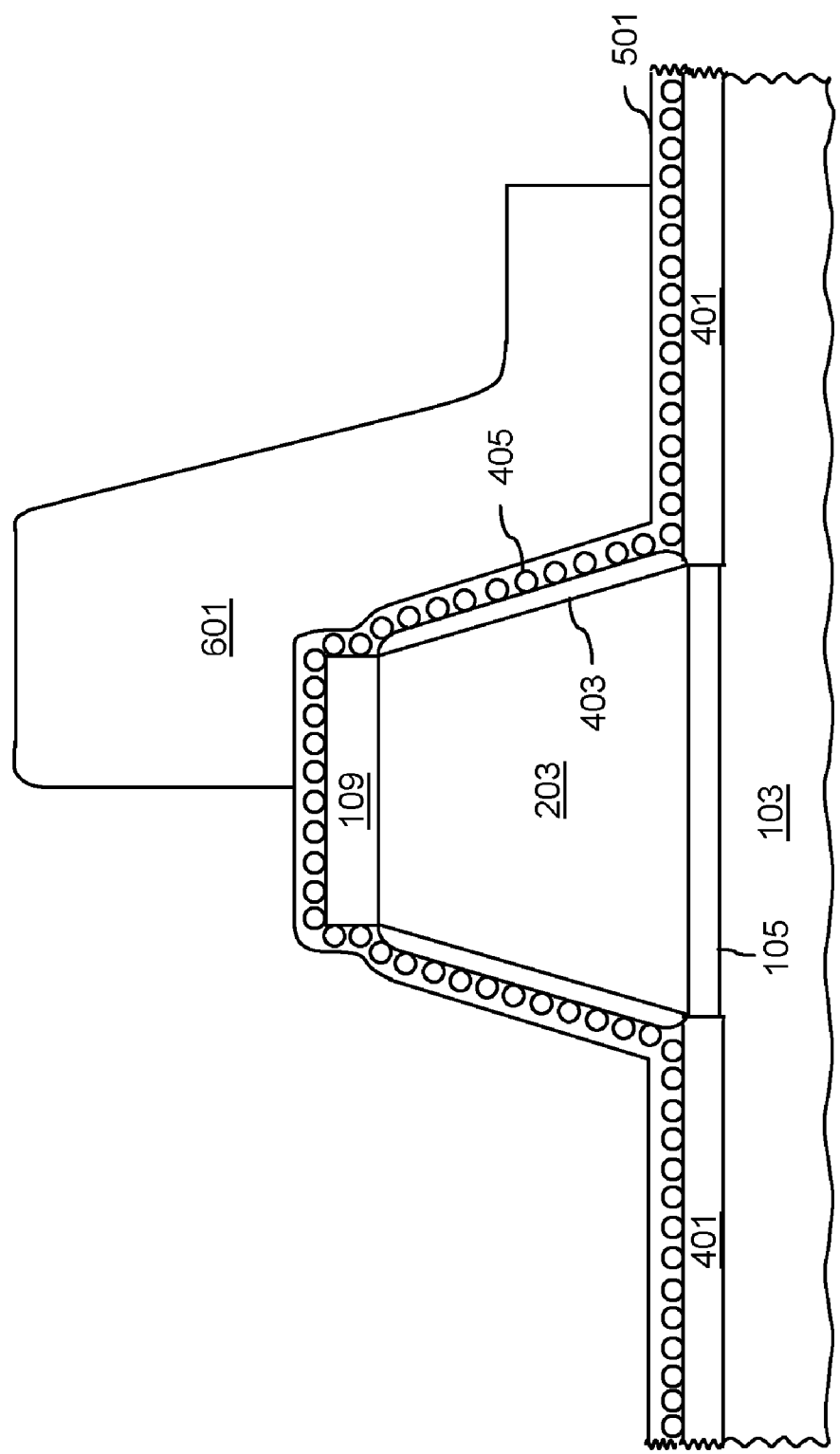

FIG. 6 shows a control gate 601 formed by patterning a second layer of gate material. In some embodiments, gate 601 has a thickness ranging between 1000 Å and 2000 Å, but may be of other thicknesses in other embodiments. In a preferred embodiment, gate 601 has a thickness of 1200 Å. The second layer of gate material is patterned as shown in the FIG. 6. It may be patterned using conventional photolithographic techniques.

Figure 7:
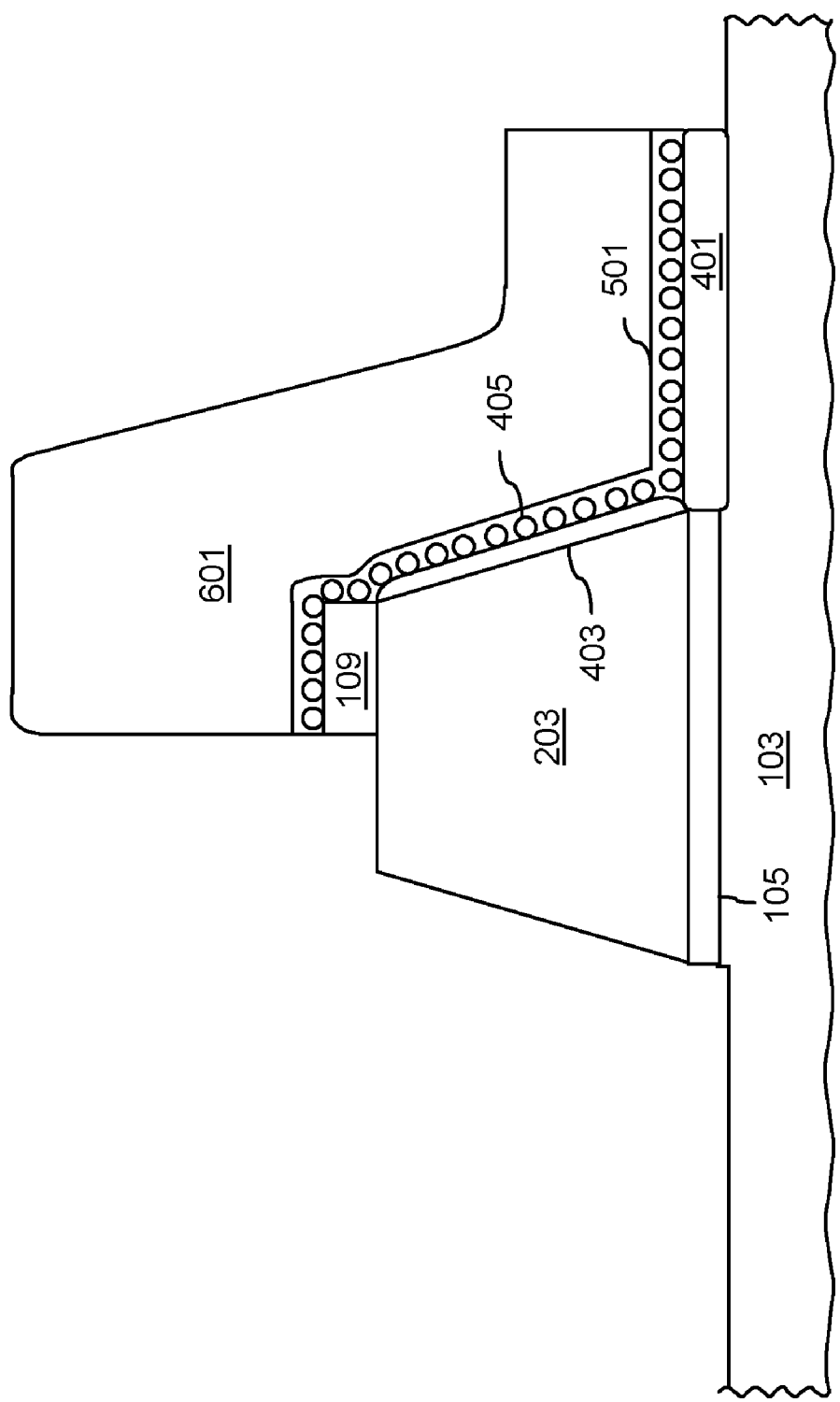

Referring to FIG. 7, the layer of tunnel dielectric 501, the ARC layer 109 and the layer of charge storage elements 405 not covered by gate 601 are etched. In one embodiment, the layer of tunnel dielectric 501 is etched using a wet etching process with hydrofluoric (HF) acid, whereas the ARC layer 109 is removed using a dry etching process, such as, etching using a combination of trifluoromethane and Oxygen gases ($CHF_3/O_2$).

Figure 8:
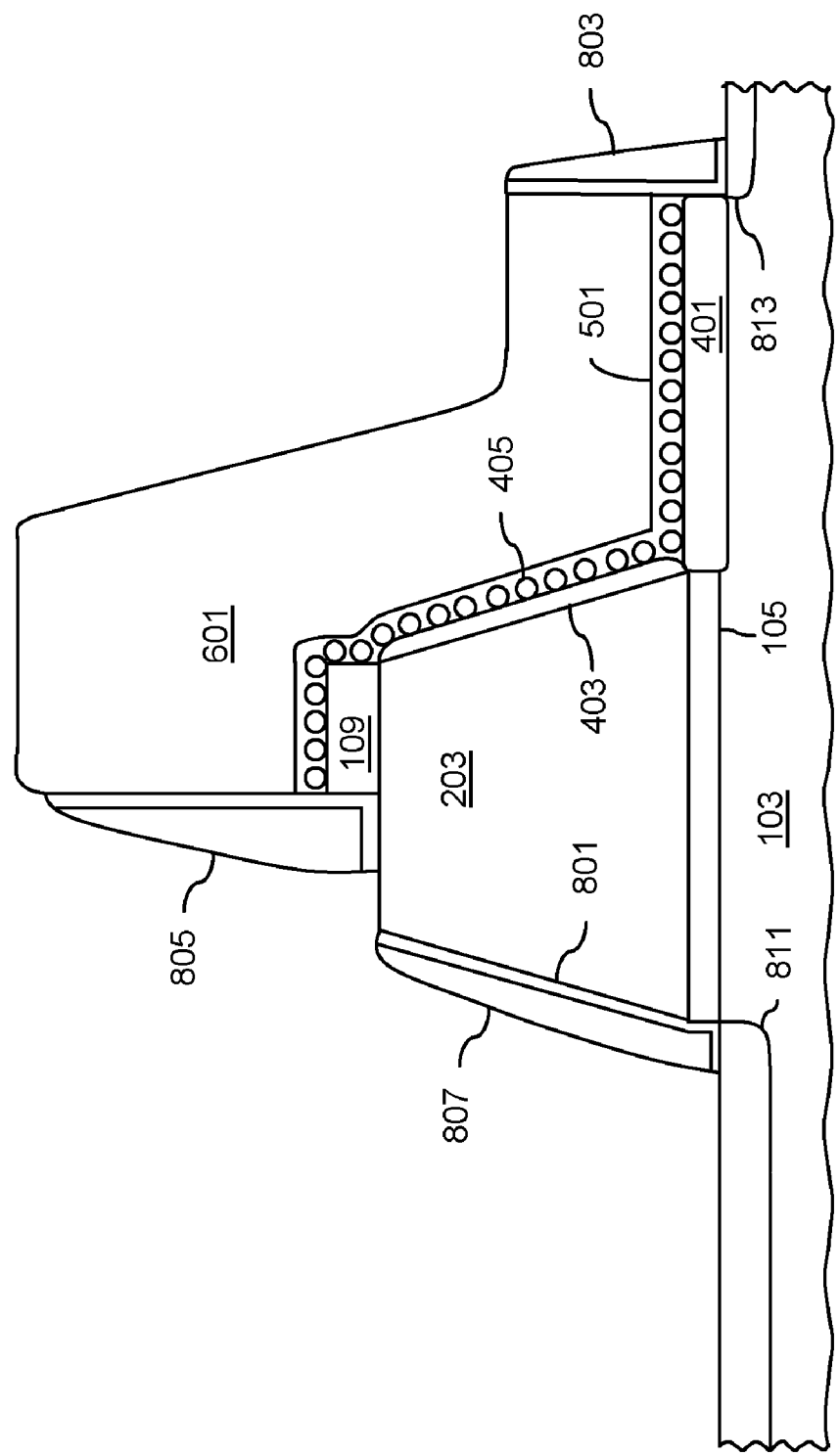

Referring to FIG. 8, a layer of oxide 801 with thickness ranging between 80 Å and 150 Å is deposited over the semiconductor wafer 101. Sidewall spacers 803, 805, and 807 are then formed as shown in FIG. 8. The sidewall spacers 803, 805, and 807 are formed by depositing material such as silicon-nitride over the semiconductor wafer 101, and then by anisotropic etching the material using an etch chemistry such as, $CF_4$/HBr/Ar, $CHF_3$/Ar, or the like. During the formation of the spacers, the layer of oxide 801 is removed from the exposed areas of the semiconductor wafer 101. Prior to forming the sidewall spacers 803, 805, and 807, areas of the substrate 103 are implanted with ions to form a current electrode extension 811 and current electrode extension 813 as shown in the FIG. 8. In some embodiments a small nitride spacer (not shown) is also formed in the corner bend of gate in FIG. 8.

Figure 9:
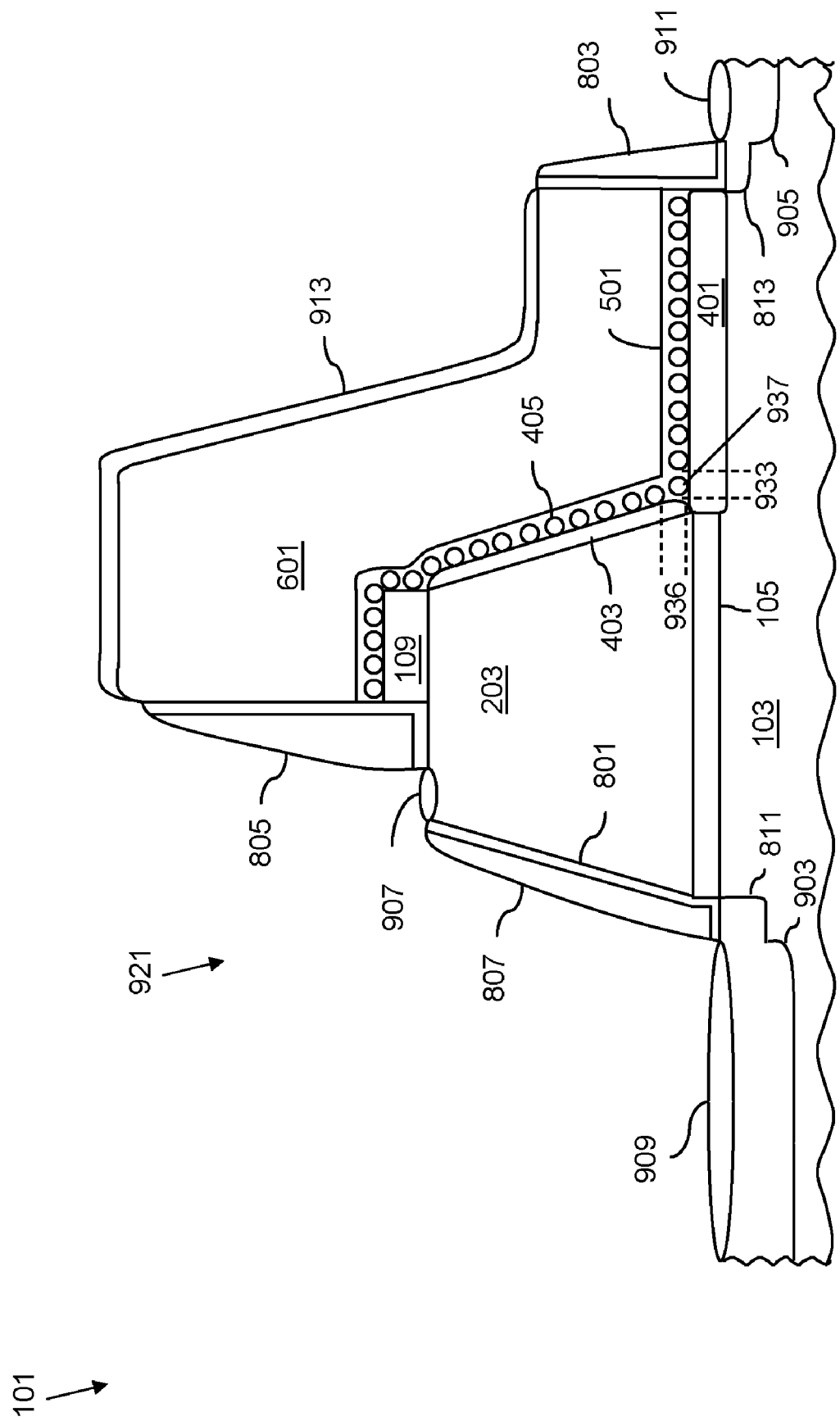

Referring to FIG. 9, ion implantation is performed to form a first current electrode region 903 and a second current electrode region 905 in the substrate 103. Ion implantation includes implanting n-type dopants or p-type dopants in the exposed areas of the substrate 103 depending upon the type of transistor desired. Examples of dopants used include, but are not limited to, boron as p-type dopant, and phosphorus and arsenic as n-type dopants. Thereafter, thermal annealing is carried out to activate the dopants. Subsequently, silicidation is carried out over the exposed portions of substrate 103, the exposed portion of the select gate 203, and the exposed portion of the control gate 601 to form the silicides 907, 909, 911, and 913. Silicides 907, 909, 911, and 913 are formed for select gate 203, the electrode region 903, current electrode region 905 and the control gate 601, respectively. In some embodiments of silicidation, a metal layer (e.g. nickel) is formed over the wafer and is heated to react with the exposed portions of silicon resulting in the formation of metal-silicon alloy (silicide) that acts as a contact for an active region of electrode structure. Afterwards, the unreacted metal is removed. Examples of metals used for the silicidation process are nickel, cobalt, and the like.

FIG. 9 shows a non-volatile memory cell 921 having a select gate 203, a control gate 601, a non-volatile storage structure consisting of the layer of charge storage elements (nanoclusters) 405, current electrode region 903 and current electrode region 905. In one embodiment, the control gate 601 has a sidewall. The lower portion of the sidewall is at an angle that is at least 10 degrees away from 90 degrees with respect to the substrate 103. In this embodiment, the select gate 203 has a sidewall facing the sidewall of the control gate. The lower portion of the sidewall is at an angle that is at least 10 degrees away from 90 degrees with respect to the substrate 103. In another embodiment, this sidewall is at an angle that is approximately between 100 and 140 degrees with respect to the substrate. In the non-volatile memory cell 921, due to the sloped structure of the select gate 203, the size of the gap nanocluster 937 in the angle portion of the layer of charge storage elements (nanoclusters) is the same as that of the other nanoclusters in the layer of charge storage elements 405. This prevents charges being trapped in the gap nanoclusters and increases the endurance properties of the nanoclusters. This also results in reduction of area in the layer of charge storage elements that affect the channel, since the number of nanoclusters that affect the channel are reduced. In FIG. 9, this area is shown by horizontal space 933 and vertical space 936. By providing a slope to the select gate and control gate, this area is reduced. This results in more cell current and lower $V_t$ when the charges are being erased in the gap region.

In the subsequent steps, other processes may be formed on the semiconductor wafer 101, including the formation of electrical interconnects in dielectric layers above the semiconductor wafer 101, followed by the formation of external conductors. After this, the semiconductor wafer 101 may be singulated e.g. with a wafer saw to form multiple integrated circuits, with each integrated circuit having multiple memory cells such as the non-volatile memory cell 921.

Figure 10:
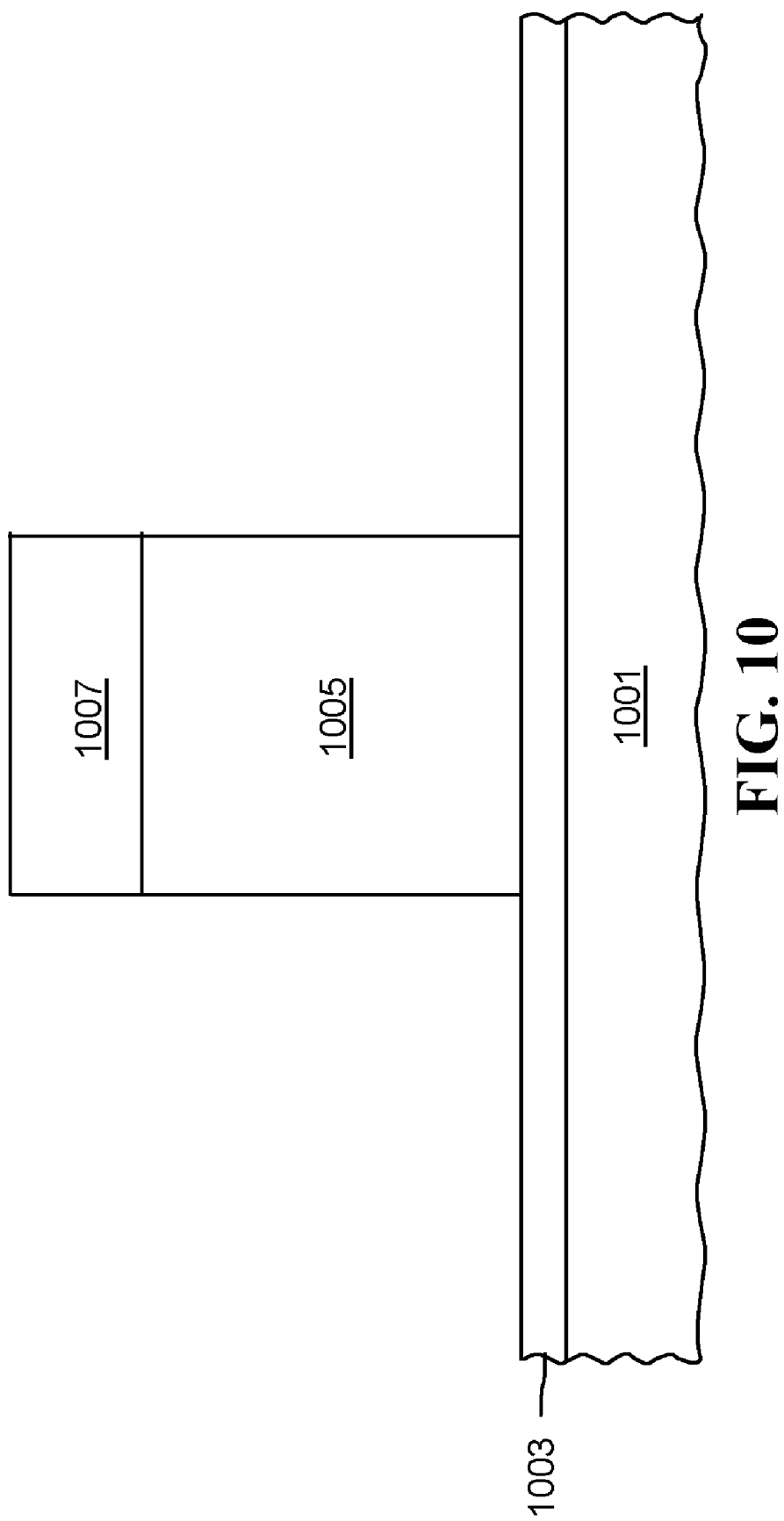
FIGS. 10-14 illustrate, in partial cutaway cross-sectional views, various stages of a wafer in the manufacture of a non-volatile memory device, in accordance with a second embodiment of the present invention.

FIG. 10 is shown, in accordance with the second embodiment of the present invention for forming a non-volatile memory device. FIG. 10 shows a cross section of a semiconductor wafer with a substrate 1001, a layer of gate dielectric 1003, a select gate 1005, and an ARC layer 1007. The layer of gate dielectric 1003 is deposited or grown over the substrate 1001 by using conventional processes. A layer of gate material is deposited over the layer of gate dielectric 1003 with thickness ranging between 800 Å and 1000 Å in some embodiment. Subsequently, a layer of ARC material with a thickness ranging between 155 Å and 1500 Å is deposited. The structure is formed, as shown in the FIG. 10, by forming a photo-resist mask not shown over the layer of ARC material and etching the layer of ARC material and the layer of gate material to form gate 1005 and ARC layer 1007. The structures shown may have other thicknesses in other embodiments.

Figure 11:
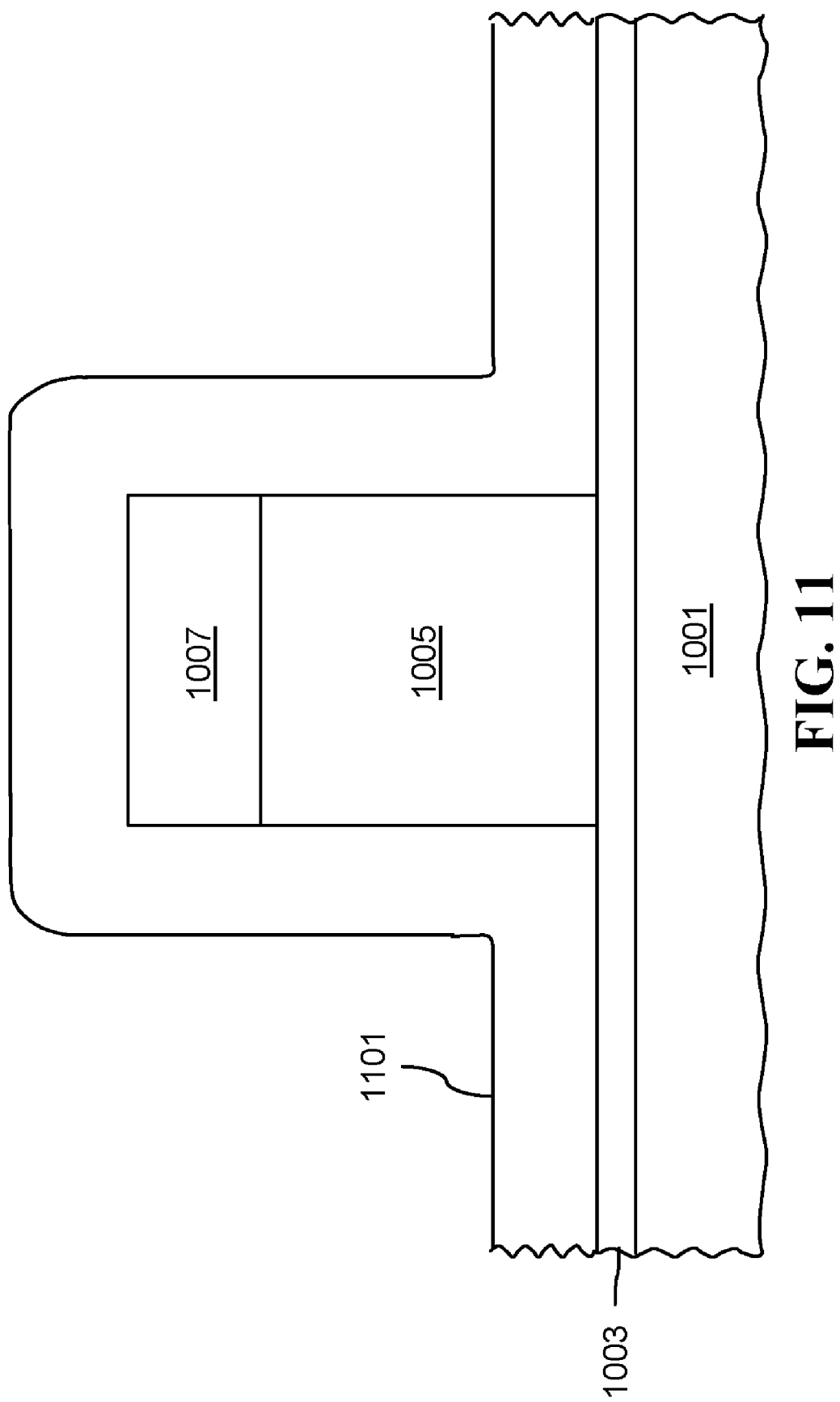

As shown in FIG. 11, a layer of polysilicon 1101 having a thickness of approximately 500 Å is deposited above ARC layer 1007 using conventional deposition techniques such as, chemical vapor deposition (CVD). In other embodiments, various other techniques may be used to deposit the layer of polysilicon 1101. In other embodiments, layer 1101 may be of other thicknesses and/or may be of other values.

Figure 12:
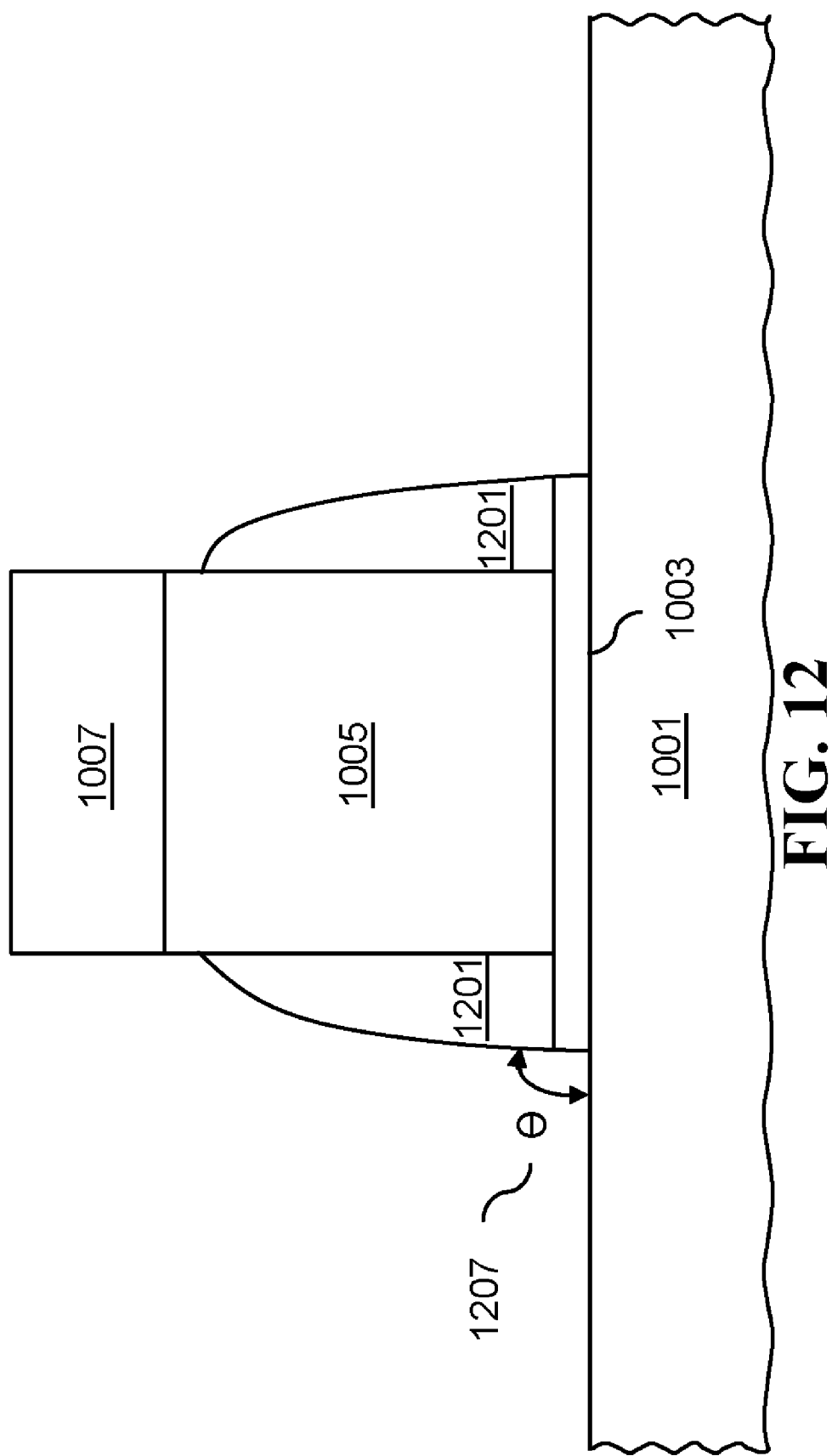

As illustrated in FIG. 12 the layer of polysilicon 1101 is etched to form spacer portions 1201 of the select gate as shown. The main advantage of forming spacer portions is that accurate control of gate lengths is achieved. Moreover, as shown in FIG. 12, there are no sharp corners between the spacer portions 1201 and the gate dielectric 1003. The structure shown is obtained by anisotropic etching such as e.g. using a Cl/HBr etch chemistry. The slope of each of the spacer portions 1201 of the select gate is obtained by varying the Cl/HBr ratio. Typically, the ratio in volume of HBr to Cl is at least 2.5 to 1 to achieve the desired structure. In an embodiment, the slope of the spacer portion 1201 has an angle Θ 1207 with respect to the substrate 1001 in a range between 100° and 140°. In a preferred embodiment, the slope has an angle Θ 1207 of 110°. This results in the select gate having tapered structure. In other embodiment, the angle is between 105 and 120 degrees. The exposed layer of gate dielectric 1003 outside the first portion of the select gate is then etched using a conventional method such as, HF etching.

Figure 13:
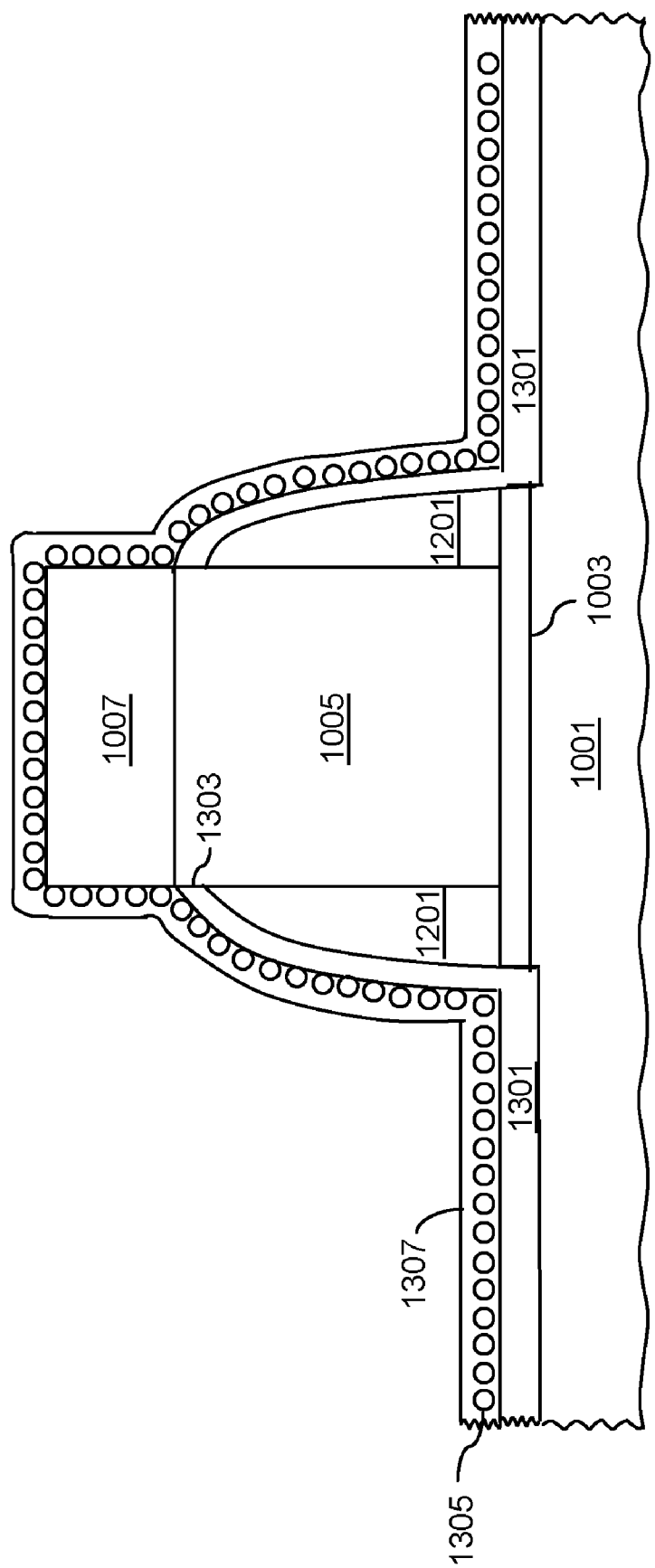

FIG. 13 depicts the formation of layers of tunnel dielectric 1301 and 1303, a layer of discrete charge storing elements 1305, and a layer of control dielectric 1307. The layers of tunnel dielectric 1301 and 1303 are thermally grown on the exposed substrate 1001 and on the sidewalls of the spacer portion 1201 outside the first portion of the select gate 1005 respectively. Subsequently, a layer of discrete charge storing elements 1305 is deposited. In one embodiment, the layer of discrete charge storing elements 1305 is a layer of nanoclusters. The size of the nanoclusters formed here are of uniform size due to the select gate being of a tapered structure.

A control dielectric 1307 is deposited over the layer of discrete charge storing elements 1305. The control dielectric 1307 may be an oxide such as silicon-oxide, hafnium-oxide, and the like.

Figure 14:
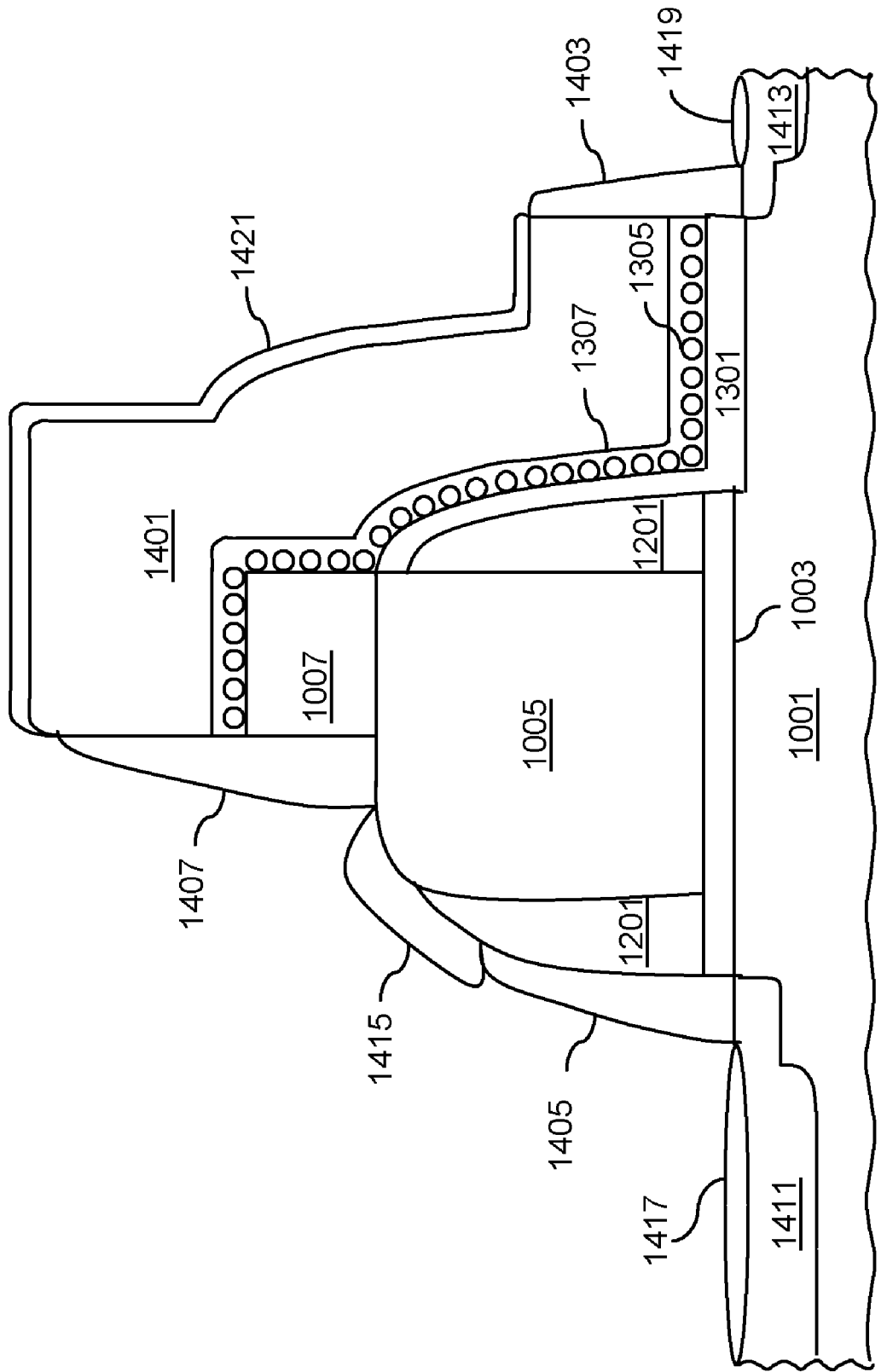

FIG. 14 shows a control gate 1401 formed by depositing a second layer of gate material over the discrete layer of charge storing elements 1305. The control gate 1401 is patterned as shown in the FIG. 14. Thereafter, the control dielectric 1307, the layer of discrete charge storing elements 1305, the tunnel dielectric 1301, and the ARC layer 1007 are removed from the exposed portions outside the control gate 1401 on the semiconductor wafer. Thereafter, the sidewall spacers 1403, 1405, and 1407 are formed by depositing a material such as silicon-nitride over the substrate 1001, and then by anisotropic etching using an etch chemistry such as $CF_4$/HBr/Argon, $CHF_3$/Argon, or the like. Prior to forming the sidewall spacers 1403, 1405, and 1407, areas of the substrate 1001 are ion implanted to form current terminal extensions. After the formation of spacers 1403, 1405, and 1407. Deeper ion implantation is performed to form the current terminal regions 1411 and 1413 as shown in FIG. 14. Thereafter, silicidation of the entire structure is done which results in the formation of silicides 1415, 1417, 1419, and 1421 for the select gate 1005, the current terminal region 1411, the current terminal region 1413, and the control gate 1401, respectively. The end of the silicidation process results in a non-volatile memory cell with the select gate 1005, the spacer portions 1201, the control gate 1401, a non-volatile storage structure of the layer of charge storage elements 1305, the current terminal region 1411, and the current terminal region 1413. In an embodiment, the spacer portion 1201 has a sidewall that has an angle which is approximately at least 10 degrees away from 90 degrees with respect to the substrate 1001. Control gate 1401 includes a corresponding sidewall facing the sidewall of spacer portion 1201 that is also at an angle that is also at least 10 degrees away from 90 degrees with respect to the substrate.

Figure 15:
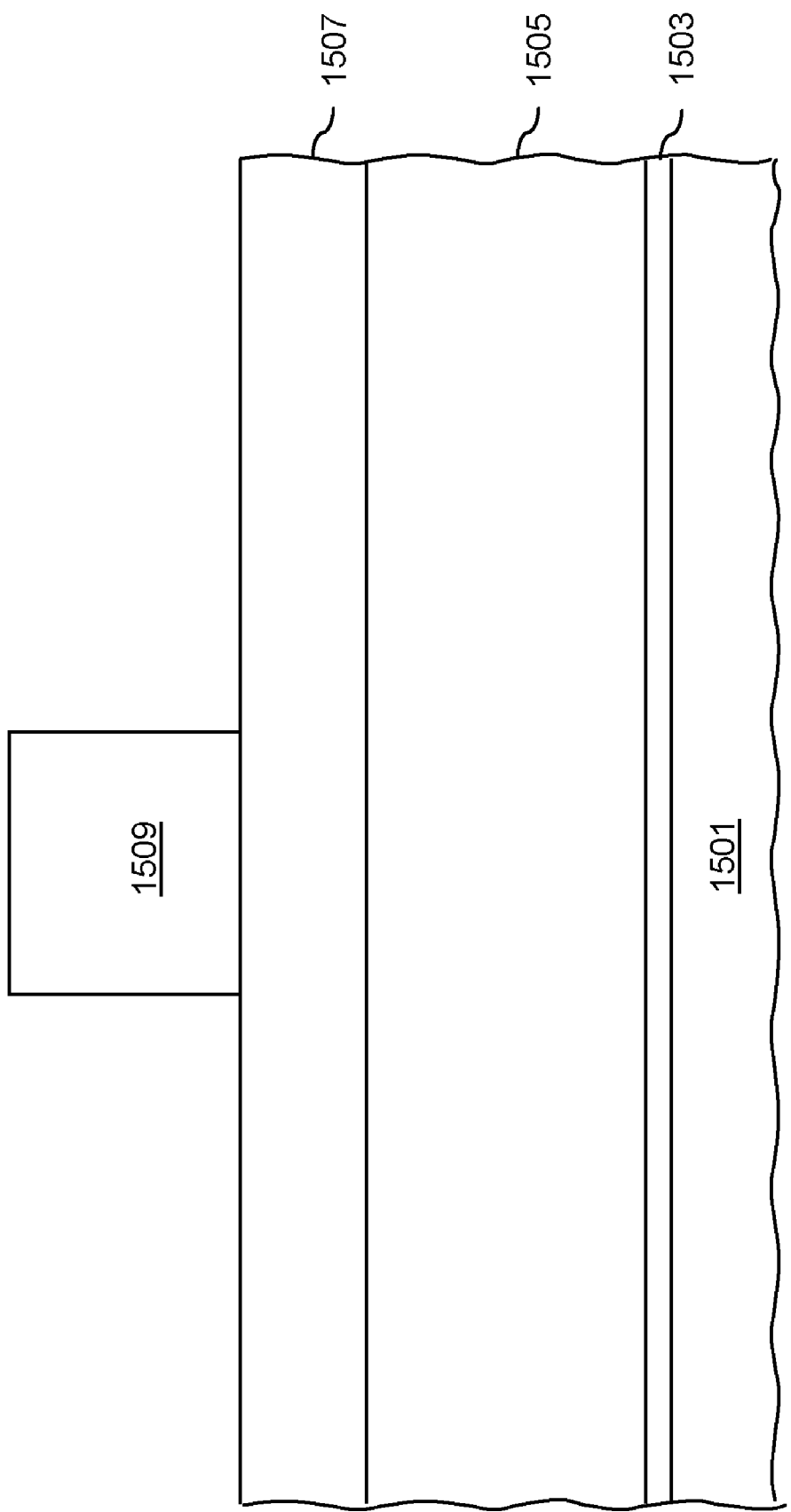
FIGS. 15-19 illustrate, in partial cutaway cross-sectional views, various stages of a wafer in the manufacture of a non-volatile memory device, in accordance with a third embodiment of the present invention.

FIG. 15 illustrates another embodiment of the present invention for fabricating a non-volatile memory cell. Wafer 1500 includes a substrate 1501, a layer of gate dielectric 1503, a layer of gate material 1505, a layer of ARC material 1507, and a photo-resist mask 1509. The layer of gate dielectric 1503 is deposited on the substrate 1501 by using conventional processes. In an embodiment, the layer of gate dielectric 1503 can be grown on the substrate 1501. The thickness of the gate dielectric is preferably between 20 Å and 60 Å, but may be of other thicknesses in other embodiments. Thereafter, the layer of gate material 1505 is deposited over the layer of gate dielectric 1503. In one example, the layer of gate material 1505 is a polysilicon layer having thickness ranging between 800 Å and 1000 Å, but may be made of other materials and be of other thicknesses in other embodiments. The layer of gate material 1505 may be deposited using a conventional chemical vapor deposition (CVD) technique, or may be deposited by other processes. Subsequently, the layer of ARC material 1507 having a thickness range between 155 Å and 1500 Å is deposited over the layer of gate material 1505. The photo-resist mask 1509 is then formed by depositing a layer of photoresist material and then patterning it. Layer 1507 may be of other thicknesses in other embodiments.

Figure 16:
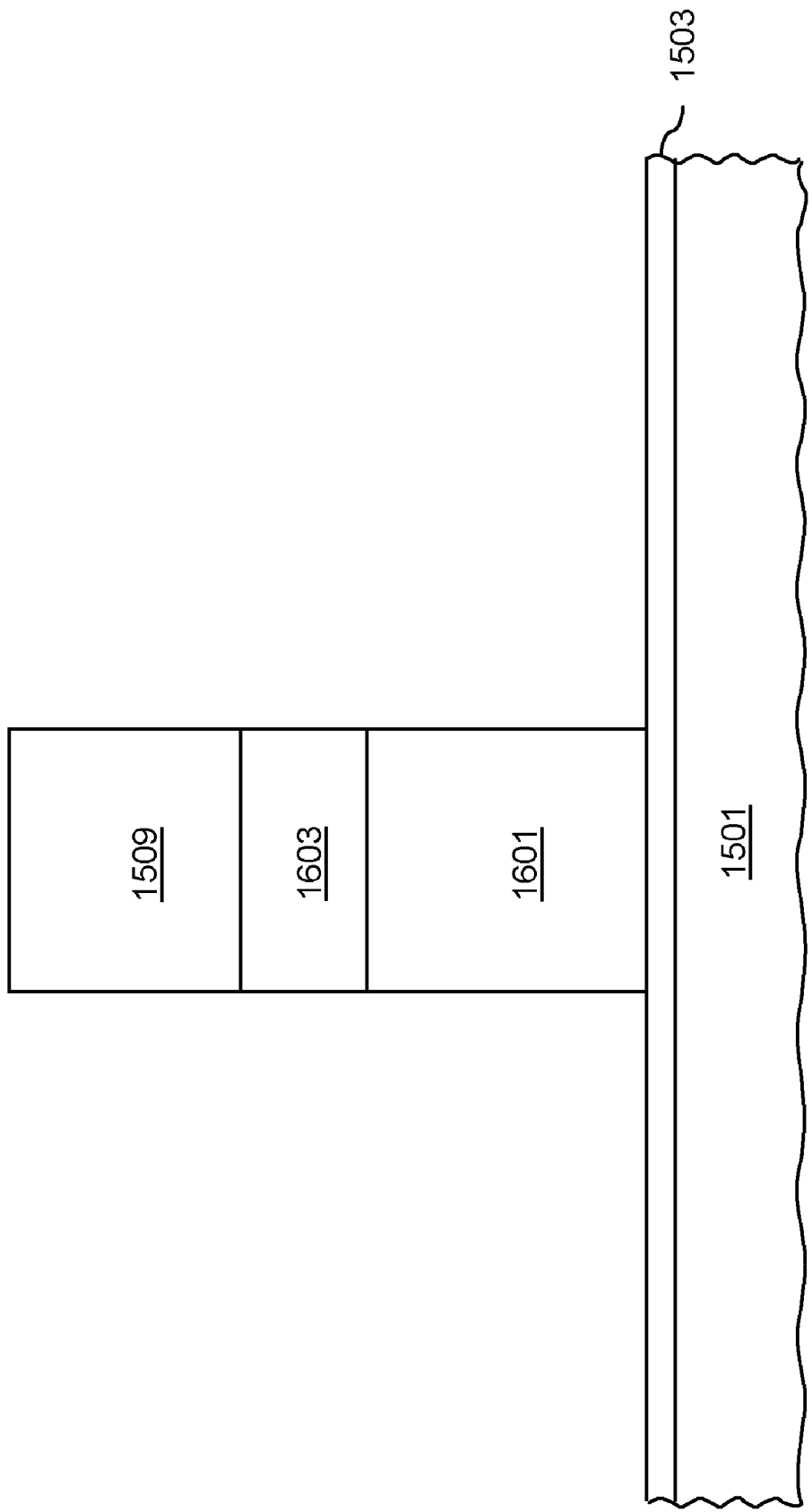

FIG. 16 depicts the semiconductor wafer after anisotropic etching of the layer of ARC material 1507 is done using the photo-resist mask 1509. Here, the layer of ARC material 1507 is etched using a $CH_4$/argon etch chemistry to obtain the ARC structure 1603. Further, the layer of gate material 1505 is etched in two steps to form the select gate 1601. In the first step, isotropic etching is done using a first etch chemistry. In an embodiment, the first etch chemistry includes using a Cl/HBr etch chemistry. At the end of the first step, the select gate 1601 is obtained that has a slope of 90 degrees with respect to the substrate 1501 as shown in FIG. 16.

Figure 17:
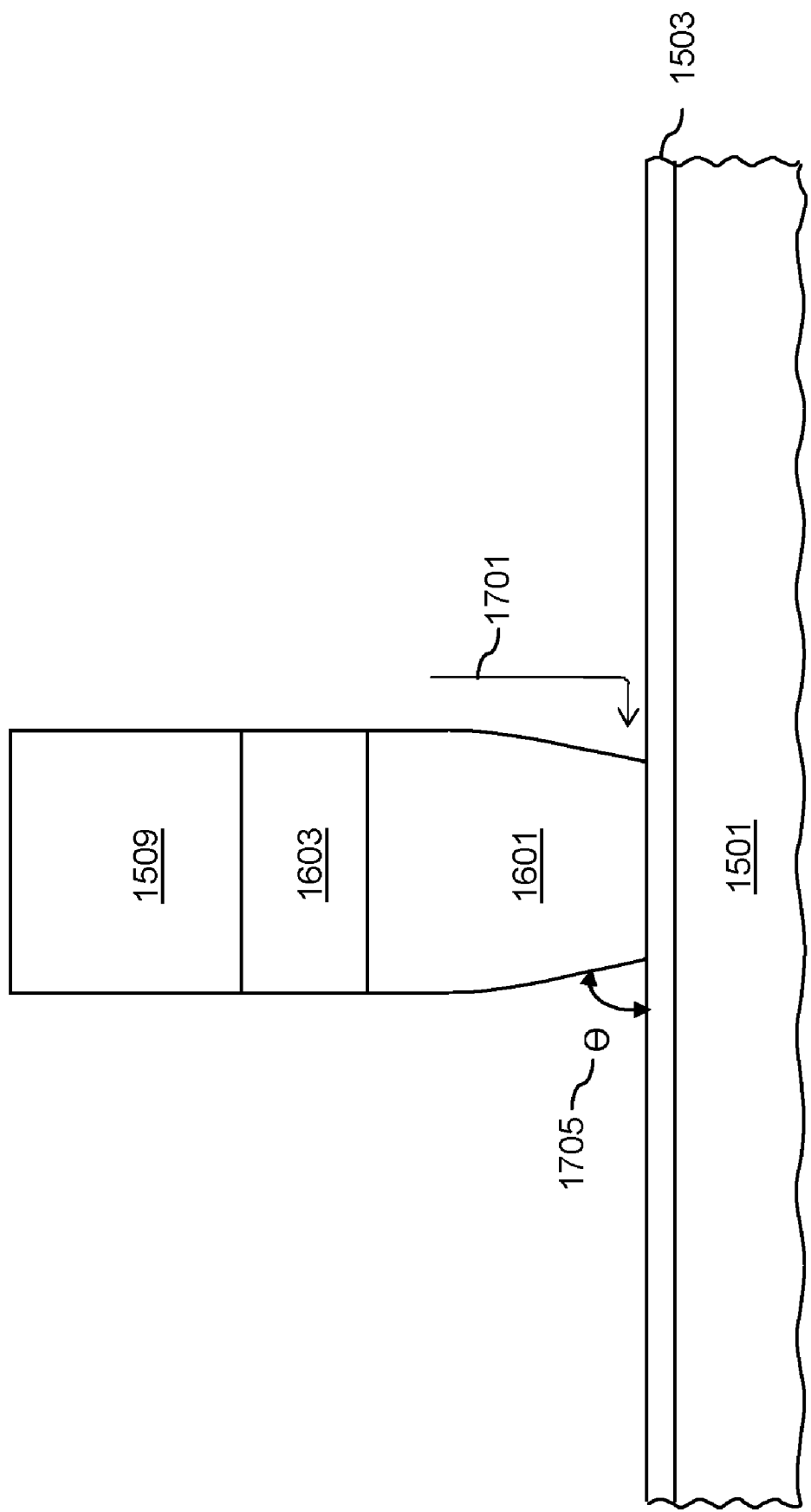

Referring now to FIG. 17, in the second etch step, the lower portion of the select gate 1601 is etched using an isotropic etch process to form a slope with respect to the substrate 1501 as shown. The slope is achieved by over etching the lower portion of the select gate 1601. Over etching of the lower portion of the select gate 1601 is performed by selective etching using a second etch chemistry. The second etch chemistry includes a Cl/HBr etch chemistry with a greater oxygen concentration by volume than that used in the first etch chemistry. In an embodiment, the oxygen concentration used in the second etch chemistry is greater than the first etch chemistry by at least 25%. Due to the high oxygen concentration, the reaction of the oxygen with the layer of gate dielectric 1503 results in the gate dielectric 1503 acting as an etch-stop layer. Hence, etching stops at the layer of gate dielectric 1503 which results in etching of the lower portion of the select gate 1601, to obtain the desired slope. In the FIG. 17, path 1701 represents the path of etching atoms in the second etch chemistry that stop at the layer of gate dielectric 1503. In an embodiment, the slope of the select gate 1601 with respect to the substrate 1501 has an angle Θ 1705 in a range between 80° and 50°. In a preferred embodiment, the slope has the angle Θ 1705 that is 75°.

In another embodiment, the select gate 1601 with the inverted sloped structure is formed by performing anisotropic etching using a single etch chemistry (Cl/HBr). In this case etching is done by decreasing the power and increasing the pressure in the ionization chamber to over etch at the bottom of the select gate 1601. In an example, the power is decreased by 30% and the pressure is increased by 20%.

Figure 18:
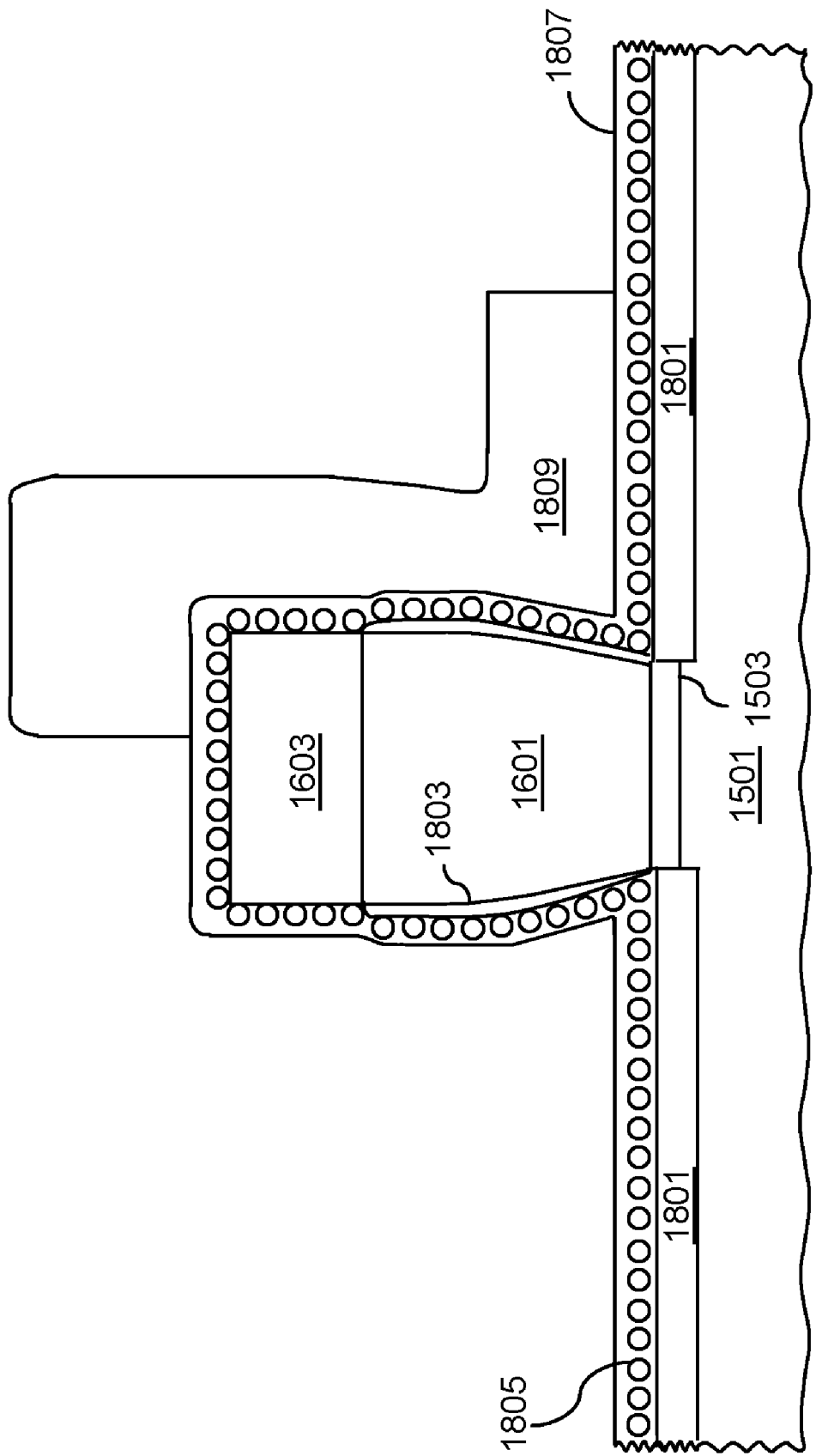

As shown in FIG. 18, the exposed layer of gate dielectric 1503 is removed outside the select gate 1601. Thereafter, a layer of tunnel dielectric 1801 is thermally grown on the substrate and a layer of tunnel dielectric 1803 is grown on the sloped sidewalls of the select gate 1601. A layer of discrete charge storing elements 1805 is then deposited, as shown in FIG. 18. In one embodiment, the layer of discrete charge storing elements 1805 may be a layer of nanoclusters. The size of the nanoclusters is uniform because of the sloped edges of the select gate 1601. A layer of dielectric material 1807 is then deposited over the layer of discrete charge storing elements 1805. Then, a control gate 1809 is formed by depositing a layer of gate material and patterning it as shown in the FIG. 18.

One of the advantages that may occur with the third embodiment of the present invention is that the non-volatile memory cell has a relatively large top surface, which increases the ease of making silicide contacts.

Figure 19:
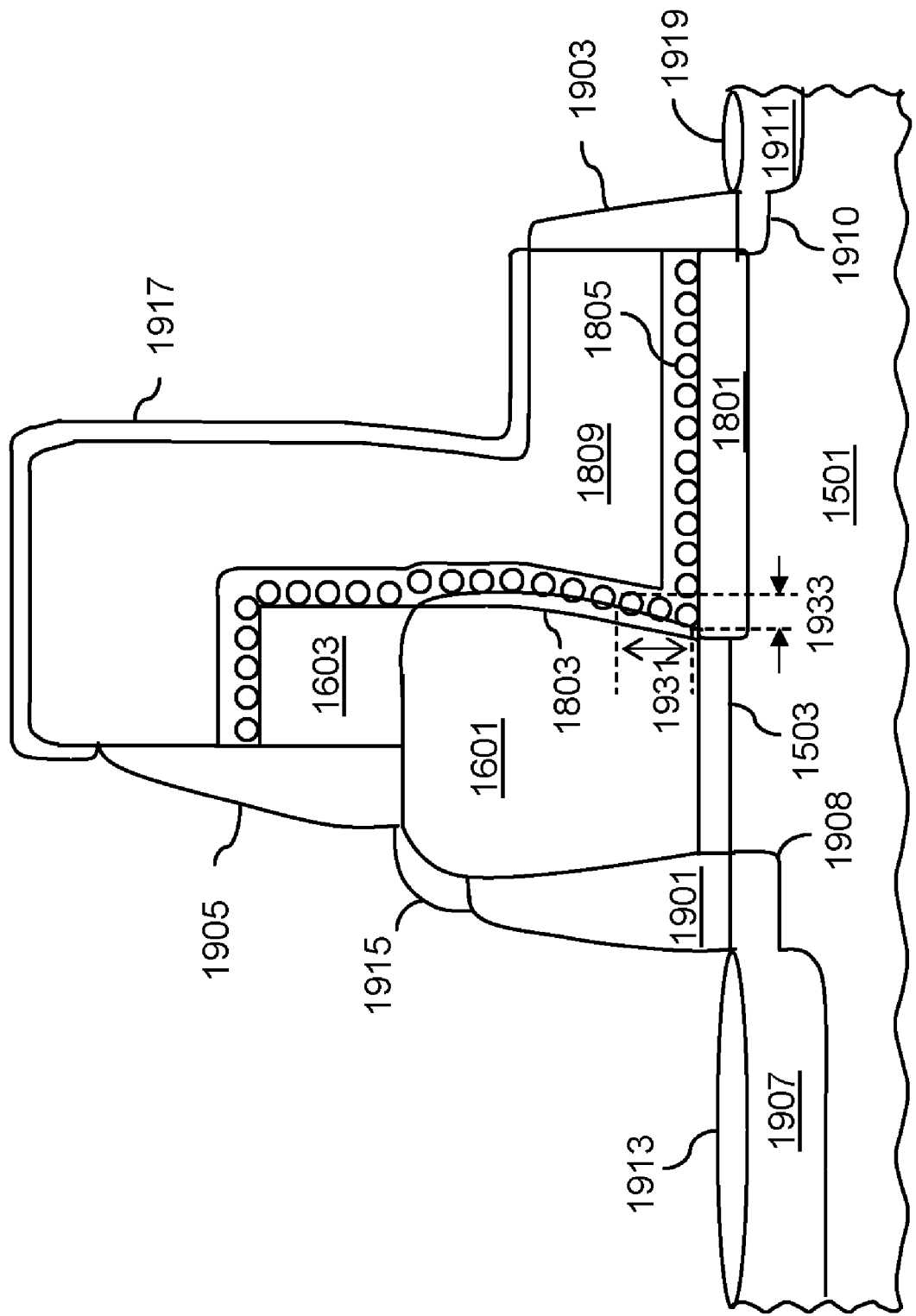

In FIG. 19 the layer 1807, the discrete layer of charge storing elements 1805, layer of tunnel dielectric 1803, and structure 1603 are removed from the exposed portions outside the control gate 1809 on the semiconductor wafer. Thereafter, the sidewall spacers 1901, 1903, and 1905 are formed. Prior to forming the sidewall spacers, areas of the substrate 1501 are ion implanted with ions to form current electrode extension 1908 and current electrode extension 1910 as shown in the FIG. 19. Thereafter, ion implantation is performed to form current electrode region 1907 and a current electrode region 1911. Then, silicidation of the exposed portion of the select gate 1601, the exposed portion of the control gate 1809 and the exposed portion of the substrate 1501 is done which results in the formation of a silicide 1913 over region 1907, a silicide 1915 over the select gate 1601, a silicide 1917 over the control gate 1809, and the silicide 1919 over region 1911. The end of the silicidation process results in a non-volatile memory cell having the select gate 1601, the control gate 1809, a non-volatile storage structure including the layer of charge storage elements (nanoclusters) 1805, the current electrode region 1907, and the current electrode region 1911. As shown in the FIG. 19, the lower portion of the select gate 1601 is at an angle with respect to the substrate 1501, the angle being approximately between 80 and 50 degrees. As shown in the FIG. 19, the nanoclusters in the area defined by spaces 1931 and 1933 that are exposed to the tunnel dielectric region 1801 are less in number as compared to a case in which the sidewall of the select gate 1601 might be at an angle of 90 degrees with respect to the substrate 1501. Thus, the number of nanoclusters affecting the channel are reduced, which results in more cell current and lower $V_t$ during erasing of charges in the gap region.

Figure 20:
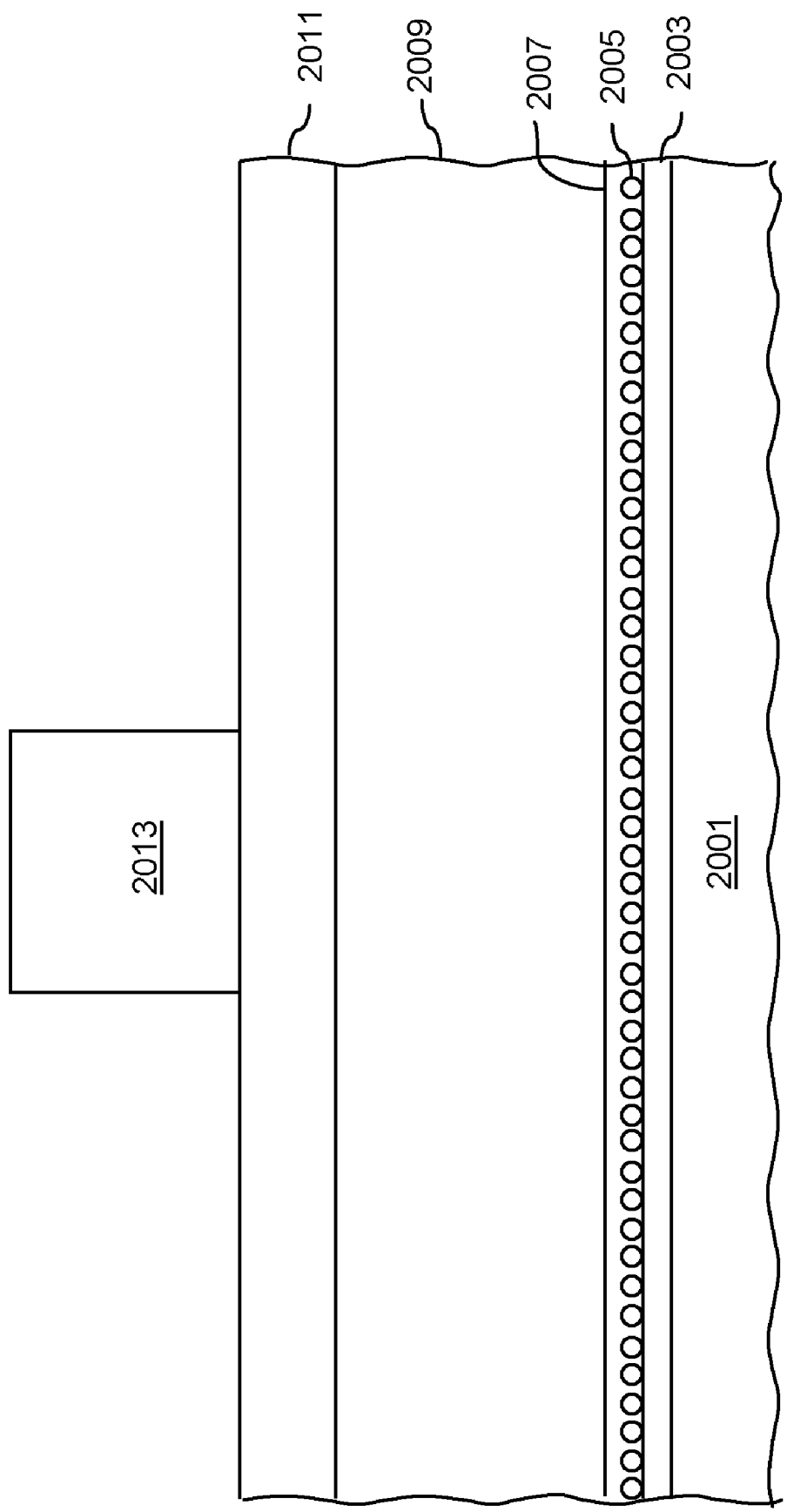
FIGS. 20-24 illustrate, in partial cutaway cross-sectional views, various stages of a wafer in the manufacture of a non-volatile memory device, in accordance with a fourth embodiment of the present invention.

FIG. 20 is shown, in accordance with another embodiment of the present invention for forming a non-volatile memory device. FIG. 20 shows a partial cutaway cross section of a semiconductor wafer 2000 with a substrate 2001, a tunnel dielectric 2003, a layer of discrete charge storage elements (e.g. nanoclusters) 2005, a control dielectric layer 2007, a layer of gate material 2009, an ARC layer 2011, and a photoresist mask 2013. The layer of tunnel dielectric 2003 is deposited or grown on the substrate 2001 by using conventional processes. In a preferred embodiment, the thickness of the layer of tunnel dielectric 2003 is 60 Å. In other embodiments, the thickness of the layer of tunnel dielectric 2003 may have different values.

A layer of charge storage elements 2005 is deposited on top of the tunnel dielectric 2003. In another embodiment, to form the layer of discrete charge storage elements 2005, silicon is implanted into the layer of tunnel dielectric 2003 and then during an annealing process, it is crystallized to form the layer of discrete charge storage elements 2005. In yet another embodiment, nanoclusters are pre-formed and then spun off to form the layer of discrete charge storage elements 2005, after the formation of the tunnel dielectric 2003. After the formation of the layer of discrete charge storage elements 2005, the control dielectric layer 2007 is deposited on layer 2005. The layer of gate material 2009 is then deposited over the control dielectric layer 2007. Thereafter, ARC layer 2011 is deposited on the layer of gate material 2009. A patterned mask 2013 is formed on layer 2011.

Figure 21:
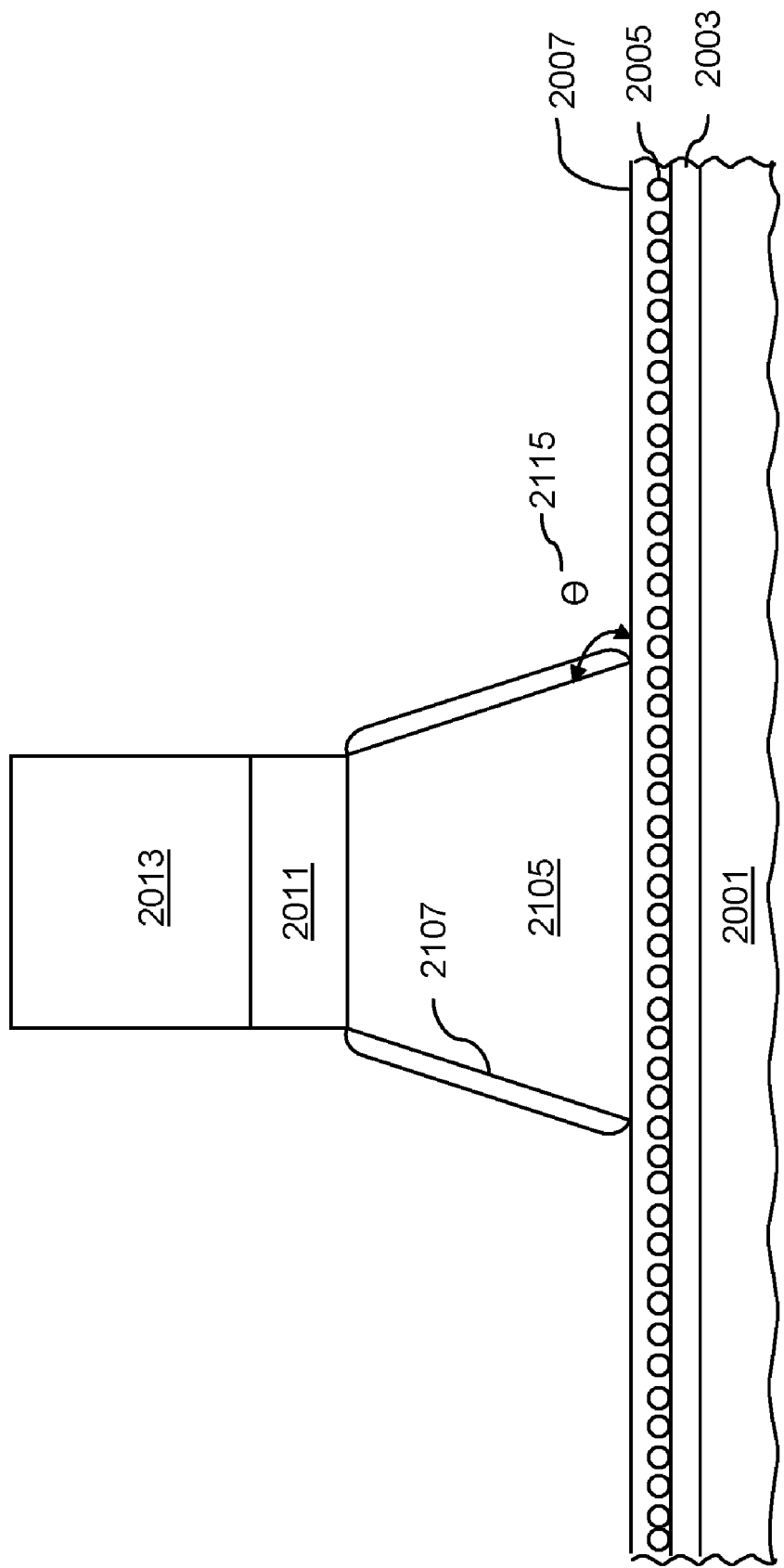

As illustrated in FIG. 21, etching of layers 2105 and 2011 is performed using patterned mask 2013. Mask 2013 is etched vertically and then the exposed layer of gate material 2009 is etched to form a sloped gate structure. In one embodiment, the slope has an angle Θ 2115 in a range between 100° and 150° with respect to the substrate 2001. In a preferred embodiment, the slope has the angle Θ 2115 of 110° with respect to the substrate 2001. The sloped gate structure is obtained by varying the etch chemistry during etching of the gate as compared to etching of the ARC layer 2011. In the preferred embodiment, the etching is an anisotropic dry etch. Layer 2011 is etched using an etch chemistry having a fluorine chemistry, such as e.g. carbon tetrafluoride ($CF_4$). The layer of gate material 2009 is etched using an etchant with an etch chemistry such as e.g. hydrogen bromide (HBr) and chlorine (Cl). The process used for etching mask 2013 and the layer of gate material 2009 is similar to the etching of the layer 109 and the layer of gate material 107 as described in the embodiments of FIG. 2. The etching of the layer of gate material 2009 results in the formation of a control gate 2105. During the etching process, due to the high proportion of HBr in the etch chemistry, a thin layer of polymer 2107 having a thickness of approximately 10 nm is deposited along the sides of the control gate 2105.

Figure 22:
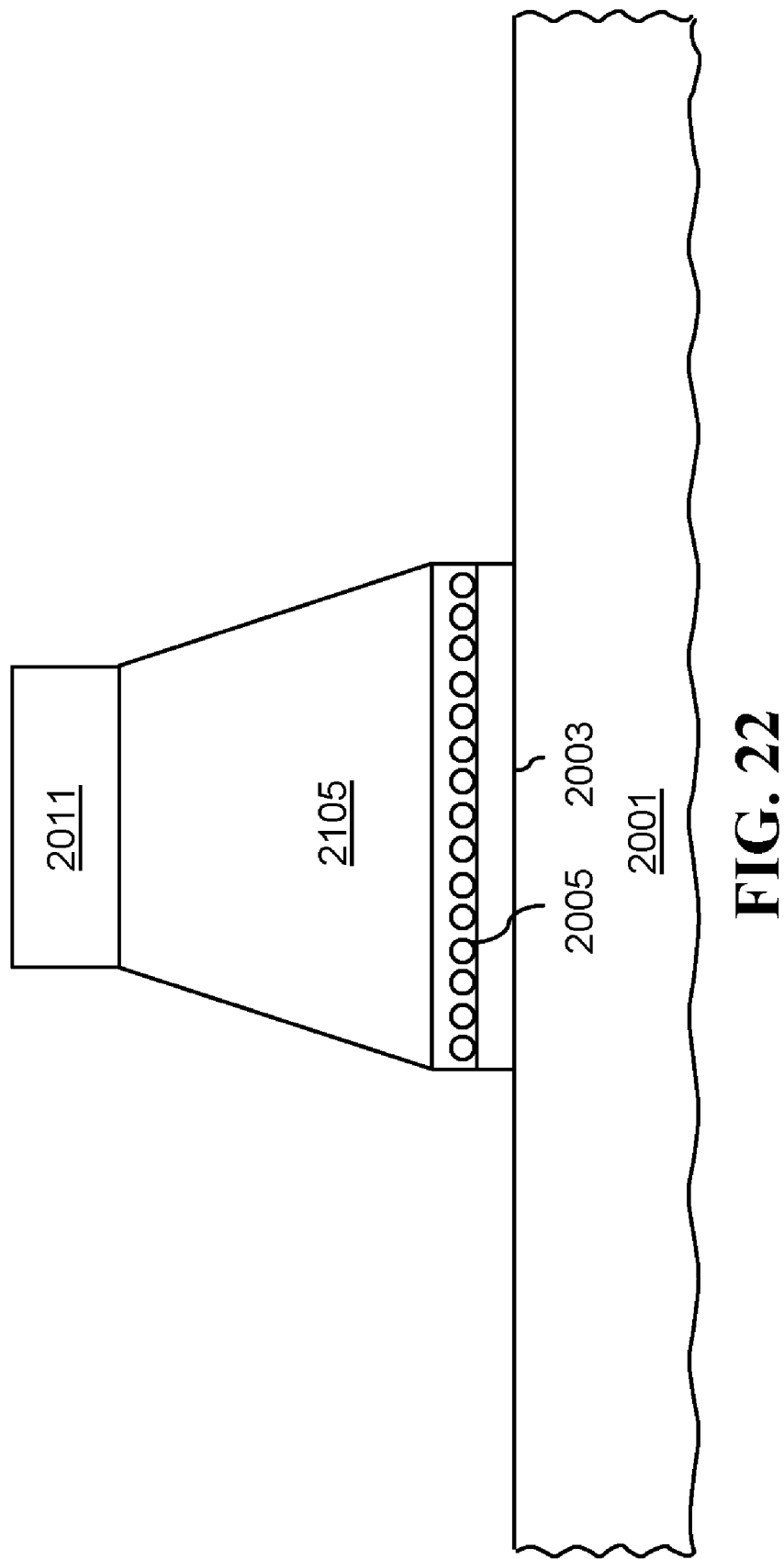

As shown in FIG. 22, the patterned mask 2013 and the thin layer of polymer 2107 are removed followed by the removal of the control dielectric layer 2007, the layer of discrete charge storage elements 2005 and the tunnel dielectric 2003 outside the control gate 2105.

Figure 23:
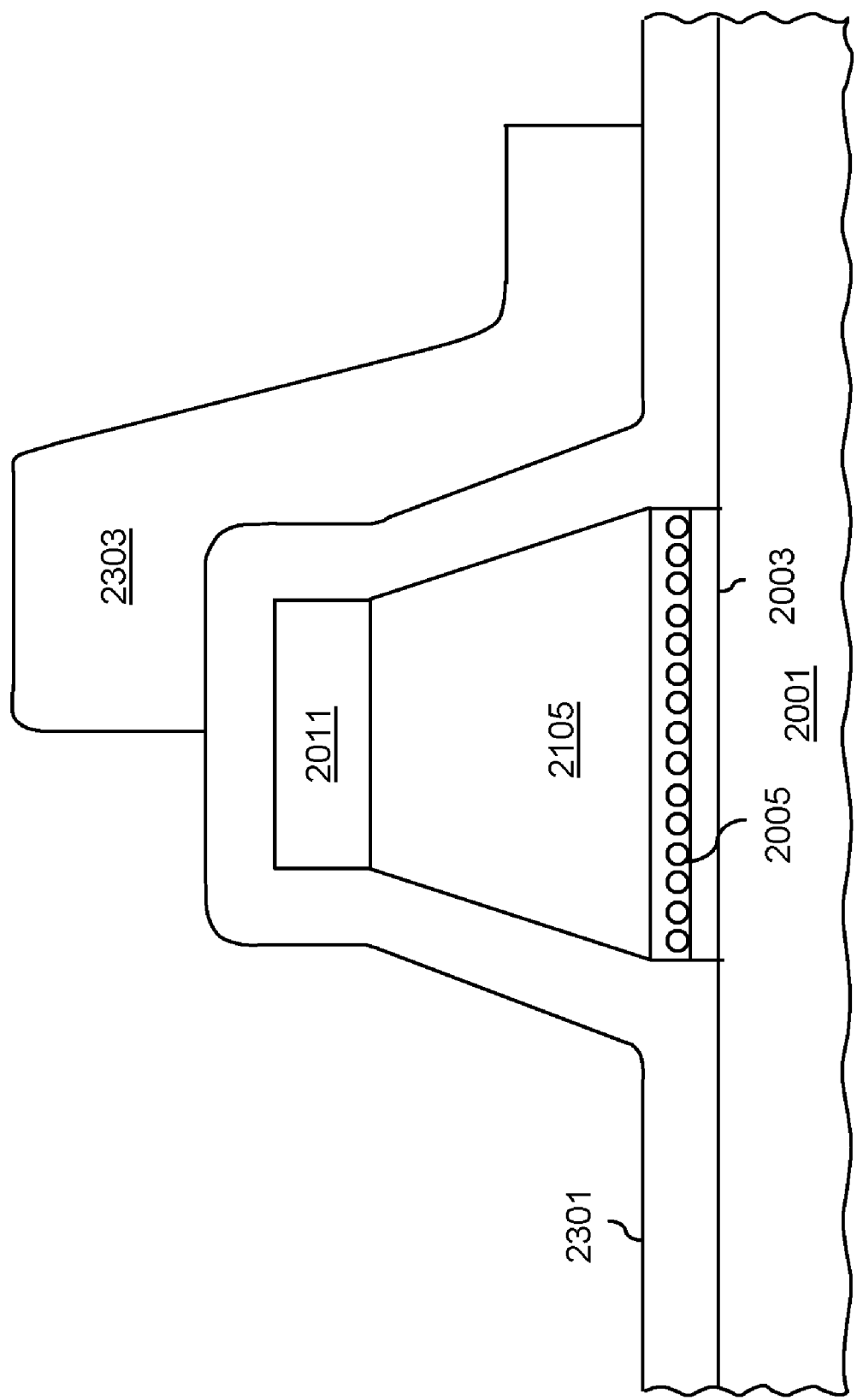

As shown in FIG. 23, gate dielectric layer 2301 is formed above layer 2011. In a preferred embodiment, the gate dielectric layer 2301 is deposited over layer 2011 using chemical vapor deposition technique. In another embodiment, gate dielectric layer 2301 is formed using a combination of deposition and thermally growing a thick layer of oxide from the substrate 2001 to the sidewalls of the control gate 2105. In this embodiment, the thermal growth of the gate dielectric layer 2301 is controlled such that it does not erode the control gate 2105. In a preferred embodiment, the material of the gate dielectric layer 2301 is silicon dioxide. In other embodiments, the material can be a metal oxide (e.g. hafnium-oxide) silicon-oxide and the like. In a preferred embodiment, the gate dielectric layer 2301 has a thickness of 200 Å. In other embodiments, the thickness of the gate dielectric layer 2301 is in the range 50 Å-500 Å, but may be of other thicknesses in other embodiments.

A layer of gate material is deposited over the gate dielectric layer 2301 and patterned as shown in the figure to form the select gate 2303.

Figure 24:
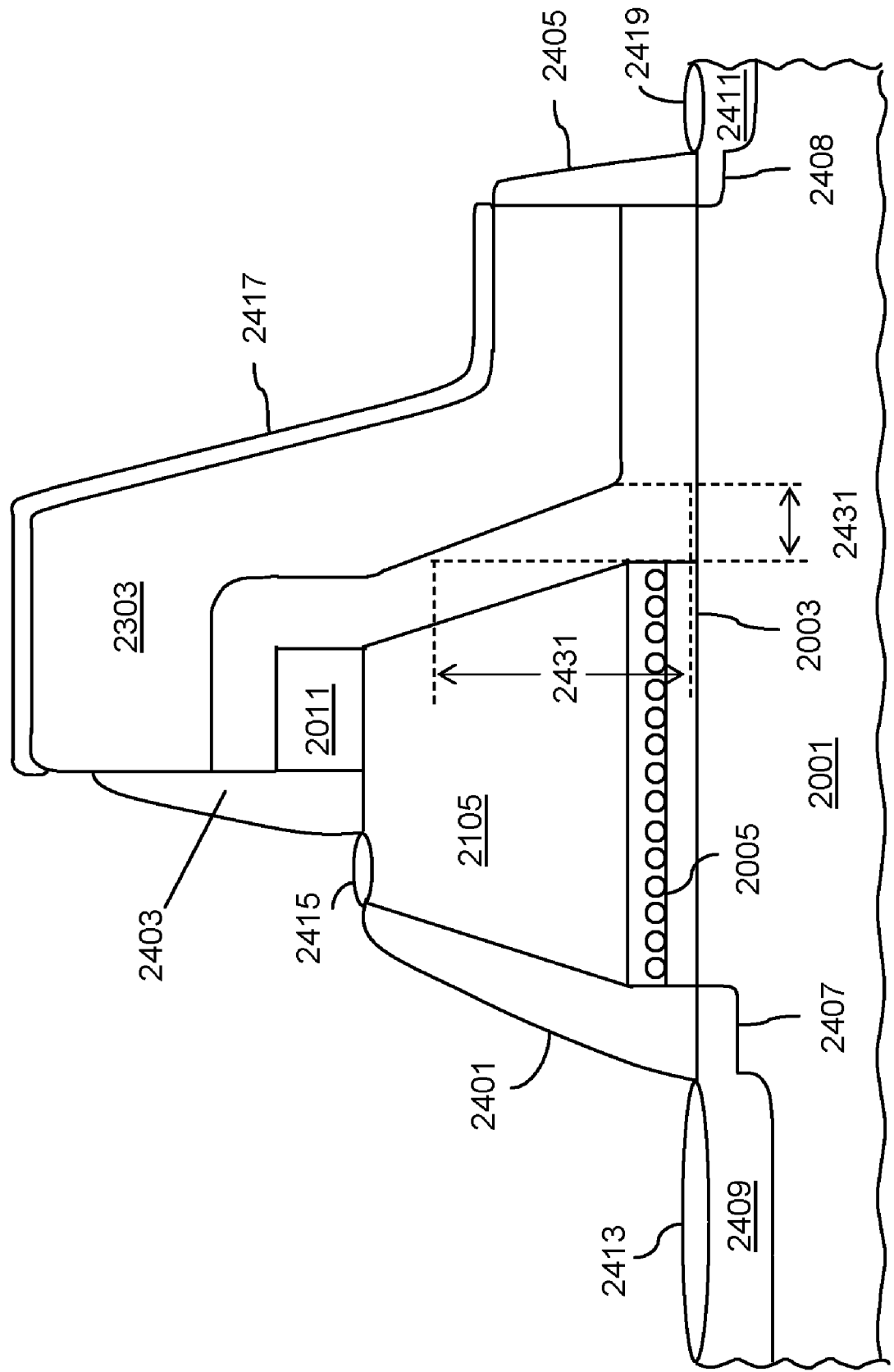

After the patterning of the select gate 2303, in FIG. 24, the gate dielectric layer 2301 outside the select gate 2303 is removed using e.g. an HF etch. Thereafter, ARC layer 2011 outside the select gate 2303 is removed using a dry etching process, such as e.g., etching using a combination of $CHF_3/O_2$. Sidewall spacers 2401, 2403, and 2405 are then formed as shown in FIG. 24. In one embodiment, sidewall spacers 2401, 2403, and 2405 are formed by depositing silicon-nitride over the semiconductor wafer and then anisotropic etching using etch chemistry such as e.g., $CF_4/HBr/Ar$, $CHF_3/Ar$, or the like. Prior to forming the sidewall spacers, areas of the substrate 2001 are implanted with ions to form current electrode extension 2407 and the current electrode extension 2408. After spacer formation, ion implantation is done to form current electrode region 2409 and current electrode region 2411 as shown in the FIG. 24. Thereafter, silicidation is done to form the silicides 2413, 2415, 2417 and 2419 for region 2409, control gate 2105, select gate 2303, and region 2411 respectively. In some embodiments, a spacer may be formed on the bend corner of gate 2303.

The embodiment of FIGS. 20-24 differs from the other embodiments in that a control gate with a sloped sidewall is formed prior to the formation of the select gate. Due to this structure, the angular gap 2431 between the lower portion of the control gate 2105 and select gate 2303 that affects the channel does not have any nanoclusters as shown in the FIG. 24. This avoids the problem of requirement of higher erase voltage due to charge trapping by nanoclusters in the gap region.

In another embodiment, the non volatile memory cell of this embodiment is formed by fabricating the control gate 2105 such it has sidewalls with inverted slopes. This is similar to the fabrication of the select gate 1601 in the embodiment of FIG. 19. With such an embodiment, control gate 2105 would have a larger top surface compared to the bottom surface. In yet another embodiment, a non volatile memory cell is formed by fabricating the control gate 2105 such that the control gate 2105 has a main portion as well as spacer portions similar to the fabrication of the select gate 1005 in the embodiment of FIG. 14.

Various embodiments described have significant advantages. The charge trapping structures used in the embodiments of FIGS. 1-19 are fabricated in such a manner that the select gate, which is formed before the formation of the control gate, has a sloped structure. This may result in a smaller nanocluster size in the angular gap between the lower portion of the select gate and the dielectric oxide layer over the substrate. This also results in obtaining nanoclusters of uniform sizes in the charge storing layer. Due to this, the erase voltage required for discharging is reduced and cell endurance during the program/erase cycling is better. Moreover, due to the sloped structures of the select gate used in the embodiments, the gap area between the lower portion of the select gate and the dielectric layer over the substrate is reduced. This results in a reduced area of the oxide layer embedding the nanoclusters that affect the channel. Hence the amount of current required for reading voltages from the cell is also reduced.

In case where the control gate with a sloped structure is formed before the formation of the select gate, in the embodiment of FIGS. 20-24, the angular gap affecting the channel does not have any nanoclusters. Hence the erase voltage required for removing charges in the gap is reduced and cell endurance during the program/erase cycling is better. With such embodiments, the sloped structures of the gates results in a smaller gap dielectric area which reduces the amount of dielectric which can affect transistor performance.

The embodiments of FIG. 9 and FIG. 14 provide for significantly small gap nanocluster sizes as well as uniformity in the size of nanoclusters in the charge trapping oxide layer. The advantage of the embodiment of FIG. 19, in addition to uniformity of nanocluster sizes, is that the top surface of the non-volatile memory cell is large, which increases the ease of making silicide contacts. The embodiment of FIG. 24 does not have nanoclusters in the gap affecting the channel threshold voltage during erasing of charges.

In one embodiment, a non-volatile memory cell comprises a substrate, a first current electrode region located in the substrate, a second current electrode region located in the substrate, a layer of discrete charge storing elements for non volatilely storing charge, and a control gate located over the substrate. The control gate has a first sidewall with a lower portion. The lower portion is at a first angle with respect to the substrate. The first angle is at least 10 degrees away from 90 degrees with respect to the substrate. The memory cell including a select gate located over the substrate. The select gate has a second sidewall with a lower portion. The second sidewall faces the first sidewall. The lower portion of the second sidewall is at a second angle with respect to the substrate that is at least 10 degrees away from 90 degrees with respect to the substrate. The memory cell includes a layer of dielectric material located between the first sidewall and the second sidewall. One of the control gate or the select gate includes a portion located over the other of the control gate or the select gate.

In another embodiment, a method of making a non-volatile memory cell includes forming a layer of discrete charge storing elements over a substrate and forming a first gate over the substrate, wherein the first gate is one of a select gate or a control gate. The forming the first gate includes forming a layer of gate material and etching the layer of gate material, wherein the first gate includes a first sidewall with a lower portion that is at an angle with respect to the substrate at least 10 degrees away from 90 degrees with respect to the substrate. The method includes forming a second gate over the substrate, wherein the second gate is an other of the select gate or the control gate. The second gate includes a second sidewall facing the first sidewall. The second sidewall includes a lower portion that is at an angle with respect to the substrate that is at least 10 degrees away from 90 degrees with respect to the substrate. The method includes forming a layer of dielectric material. The layer of dielectric material includes a portion located between the first sidewall and the second sidewall.

In another embodiment, a non-volatile memory cell includes a substrate, a first current electrode region in the substrate, a second current electrode region in the substrate, and a select gate located over the substrate. The select gate includes a first sidewall having a lower portion that is at an angle with respect to the substrate that is at least 10 degrees away from 90 degrees with respect to the substrate. The memory cell includes a control gate located over the substrate. The control gate includes a second sidewall facing the first sidewall. The memory cell includes a layer of discrete charge storing elements for non volatilely storing charge. A first portion of the layer is located between the control gate and the substrate and a second portion of the layer is located between the first sidewall and the second sidewall.

Note that not all of the activities described above in the general description or the examples are required, that a portion of a specific activity may not be required, and that one or more further activities may be performed in addition to those described. Still further, the order in which activities are listed are not necessarily the order in which they are performed.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A non-volatile memory cell comprising:
a substrate;
a first current electrode region located in the substrate;
a second current electrode region located in the substrate;
a layer of discrete charge storing elements for non volatilely storing charge;
a control gate located over the substrate, the control gate having a first sidewall with a lower portion, the lower portion is at a first angle with respect to the substrate, the first angle being at least 10 degrees away from 90 degrees with respect to the substrate;
a select gate located over the substrate, the select gate having a second sidewall with a lower portion, the second sidewall facing the first sidewall, the lower portion of the second sidewall is at a second angle with respect to the substrate that is at least 10 degrees away from 90 degrees with respect to the substrate;
a layer of dielectric material located between the first sidewall and the second sidewall;
wherein one of the control gate or the select gate includes a portion located over the other of the control gate or the select gate.

2. The non-volatile memory cell of claim 1 wherein, the layer of discrete charge storing elements includes a portion located between the control gate and the select gate.

3. The non-volatile memory cell of claim 1 wherein:
the control gate includes a portion located over the select gate;
the layer of discrete charge storing elements includes a portion located between the control gate and the select gate;
wherein the second angle is approximately between 100 and 140 degrees with respect to the substrate.

4. The non-volatile memory cell of claim 1 wherein:
the control gate includes a portion located between the select gate and the substrate;
none of the layer of discrete charge storing elements is located between the control gate and the select gate.

5. The non-volatile memory cell of claim 1 wherein:
the control gate includes a portion located over the select gate;
the layer of discrete charge storing elements includes a portion located between the control gate and the select gate;
wherein the second angle is approximately between 80 and 50 degrees with respect to the substrate.

6. The non-volatile memory cell of claim 1 wherein:
the control gate includes a portion located over the select gate;
the layer of discrete charge storing elements includes a portion located between the control gate and the select gate;
wherein the second angle is greater than approximately 100 degrees with respect to the substrate;
the select gate includes a first portion formed from a layer of gate material, the first portion including a third sidewall at approximately 90 degrees with respect to the substrate and a spacer portion located on the third sidewall, the spacer portion from a second layer of gate material, the spacer portion including the second sidewall.

7. The non-volatile memory cell of claim 2 wherein:
the control gate includes a portion located over the select gate;
the layer of discrete charge storing elements includes a portion located between the control gate and the select gate;
wherein the second angle is approximately between 100 and 140 degrees with respect to the substrate.

8. A non-volatile memory cell comprising:
a substrate;
a first current electrode region in the substrate;
a second current electrode region in the substrate;
a select gate located over the substrate, the select gate including a first sidewall having a lower portion that is at an angle with respect to the substrate that is at least 10 degrees away from 90 degrees with respect to the substrate;
a control gate located over the substrate, the control gate including a second sidewall facing the first sidewall;
a layer of discrete charge storing elements for non volatilely storing charge, a first portion of the layer is located between the control gate and the substrate and a second portion of the layer is located between the first sidewall and the second sidewall.

9. The non-volatile memory cell of claim 8 wherein:
the lower portion is at an angle with the substrate in the range of approximately 100 degrees to 140 degrees with respect to the substrate.

10. The non-volatile memory cell of claim 8 wherein the entire first wall is at an angle with respect to the substrate that is at least 10 degrees away from 90 degrees with respect to the substrate.

11. The non-volatile memory cell of claim 8 wherein the discrete charge storing elements have a generally uniform size across the layer.

12. The non-volatile memory cell of claim 8 wherein the control gate includes a portion located over a first top portion of the select gate, wherein no portion of the control gate is located over a second portion of the select gate.

13. The non-volatile memory cell of claim 8 wherein the second sidewall includes a lower portion that is at an angle with respect to the substrate that is at least 10 degrees away from 90 degrees with respect to the substrate.

14. The non-volatile memory cell of claim 9 wherein the entire first wall is at an angle with respect to the substrate that is at least 10 degrees away from 90 degrees with respect to the substrate.

15. The non-volatile memory cell of claim 9 wherein the discrete charge storing elements have a generally uniform size across the layer.

16. The non-volatile memory cell of claim 9 wherein the control gate includes a portion located over a first top portion of the select gate, wherein no portion of the control gate is located over a second portion of the select gate.

17. The non-volatile memory cell of claim 10 wherein the control gate includes a portion located over a first top portion of the select gate, wherein no portion of the control gate is located over a second portion of the select gate.

18. The non-volatile memory cell of claim 9 wherein the second sidewall includes a lower portion that is at an angle with respect to the substrate that is at least 10 degrees away from 90 degrees with respect to the substrate.

19. The non-volatile memory cell of claim 10 wherein the second sidewall includes a lower portion that is at an angle with respect to the substrate that is at least 10 degrees away from 90 degrees with respect to the substrate.

20. The non-volatile memory cell of claim 11 wherein the second sidewall includes a lower portion that is at an angle with respect to the substrate that is at least 10 degrees away from 90 degrees with respect to the substrate.

21. The non-volatile memory cell of claim 12 wherein the second sidewall includes a lower portion that is at an angle with respect to the substrate that is at least 10 degrees away from 90 degrees with respect to the substrate.

* * * * *